(12) United States Patent
Miura et al.

(10) Patent No.: US 7,692,454 B2
(45) Date of Patent: Apr. 6, 2010

(54) SIGNAL CONVERTING CIRCUIT

(75) Inventors: Satoshi Miura, Tokyo (JP); Makoto Masuda, Chiba (JP)

(73) Assignee: Thine Electronics, Inc., Tokyo (JP)

( * ) Notice: Subject to any disclaimer, the term of this patent is extended or adjusted under 35 U.S.C. 154(b) by 65 days.

(21) Appl. No.: 11/910,068

(22) PCT Filed: May 17, 2006

(86) PCT No.: PCT/JP2006/309854

§ 371 (c)(1),
(2), (4) Date: Sep. 28, 2007

(87) PCT Pub. No.: WO2006/126436

PCT Pub. Date: Nov. 30, 2006

(65) Prior Publication Data

US 2008/0272821 A1 Nov. 6, 2008

(30) Foreign Application Priority Data

May 26, 2005 (JP) ............................. 2005-154121

(51) Int. Cl.
*H03K 5/22* (2006.01)
(52) U.S. Cl. .................... 327/65; 327/563; 330/253
(58) Field of Classification Search ............. 327/63, 327/65, 66, 563; 330/253, 257, 258
See application file for complete search history.

(56) References Cited

U.S. PATENT DOCUMENTS

2007/0146063 A1* 6/2007 Nakamoto et al. .......... 327/563
2008/0258812 A1* 10/2008 Khoury et al. .............. 330/253

FOREIGN PATENT DOCUMENTS

JP   2000-114892 A   4/2000
JP   2005-223872 A   8/2005

* cited by examiner

*Primary Examiner*—Long Nguyen
(74) *Attorney, Agent, or Firm*—Sughrue Mion, PLLC

(57) ABSTRACT

A signal conversion circuit 2 comprises a differential amplifier portion 10 and a source follower portion 20. When differential voltage signals INp and INn are input to a first input terminal 5 and second input terminal 6 respectively, operations occurs either in a mode in which only the differential amplifier portion 10 operates, or a mode in which both the differential amplifier portion 10 and the source follower portion 20 operate, or a mode in which only the source follower portion 20 operates, according to the levels of the differential voltage signals INp and INn. The differential amplifier portion 10 and source follower portion 20 have fewer components compared with a circuit comprising two differential amplifier circuits. By this means, the circuit area can be reduced, and in addition current consumption can be reduced. Also, because the source follower portion 20 performs non-inverting amplification of the differential voltage signals INp and INn, high-speed operation is possible.

4 Claims, 8 Drawing Sheets

SIGNAL CONVERTING CIRCUIT

TECHNICAL FIELD

This invention relates to a signal conversion circuit, and in particular relates to a signal conversion circuit which converts the common-mode voltage of differential voltage signals.

BACKGROUND ART

In a reception device which receives differential voltage signals, a common-mode voltage offset which depends on the transmission device and on the state of the transmission line, and a broad input common-mode voltage to accommodate a low-voltage interface, are sought. Such a reception device is provided with a signal conversion circuit to convert the common-mode voltage of input differential signals into a prescribed voltage level. For example, in an LVDS (Low-Voltage Differential Signaling) reception device which transmits and receives digital signals by changing the current direction in a pair of resistance-terminated differential transmission lines, a signal conversion circuit converts the input common-mode voltage into a voltage which is higher than the sum of a prescribed offset voltage plus the threshold voltage (Vthn) of an NMOS transistor, in order to cause a later-stage high-speed NMOS differential amplifier to operate. Further, in electronic equipment in which lower power supply voltages are being adopted, so-called rail-to-rail operation of circuits is required in order to secure a dynamic range.

A rail-to-rail input signal conversion circuit described in Patent Reference 1 comprises a first differential amplifier circuit, in which an n-type transistor receives input signals, and a second differential amplifier circuit, in which a p-type transistor receives input signals. In this signal conversion circuit, by operating the first amplifier circuit with the input voltage level in a region higher than a prescribed threshold voltage, and by operating the second amplifier circuit with the input voltage level in a region lower than a prescribed threshold voltage, there is mutual compensation, and rail-to-rail input operation is realized.

Patent Reference 1: Japanese Patent Laid-open No. 2000-114892

In the amplifier circuit described in Patent Reference 1, because the operating speed is constrained by the transistor load capacitance, there is the problem that high-speed circuit operation is difficult to achieve. Further, two differential amplifier circuits must be prepared in order to convert the input common-mode voltage, and so there are the problems of an increase in circuit area and greater current consumption.

Hence this invention provides a signal conversion circuit which can decrease the circuit area and reduce current consumption, and which enables faster operation.

DISCLOSURE OF THE INVENTION

A first signal conversion circuit of the invention is a signal conversion circuit which takes as input differential voltage signals to a first input terminal and a second input terminal, converts the common-mode voltage level of the differential voltage signals, and outputs differential voltage signals, with the common-mode voltage level converted, from a first output terminal and a second output terminal, and is characterized by comprising: (1) a first resistor, one end of which is connected to a high-potential side of a power supply, and the other end of which is connected to the first output terminal; (2) a second resistor, one end of which is connected to the high-potential side of the power supply, and the other end of which is connected to the second output terminal; (3) a first NMOS transistor, having a drain electrode connected to the first output terminal, a gate electrode connected to the second input terminal, and a source electrode; (4) a second NMOS transistor, having a drain electrode connected to the second output terminal, a gate electrode connected to the first input terminal, and a source electrode; (5) a first PMOS transistor, having a source electrode connected to the first output terminal, a gate electrode connected to the first input terminal, and a drain electrode connected to a low-potential side of the power supply; (6) a second PMOS transistor, having a source electrode connected to the second output terminal, a gate electrode connected to the second input terminal, and a drain electrode connected to the low-potential side of the power supply; and (7) a current source, which is provided between the source electrode of the first NMOS transistor and source electrode of the second NMOS transistor on the one hand, and the low-potential side of the power supply on the other, and which generates a constant current.

In this first signal conversion circuit, the first resistor, second resistor, first NMOS transistor, and second NMOS transistor form a differential amplifier. And, the first PMOS transistor and second PMOS transistor act as a source follower. The first input terminal and second input terminal are connected to the differential amplifier and source follower. Consequently, when differential voltage signals are input to the first input terminal and second input terminal, operation is in either a differential amplifier-only mode, or both differential amplifier and source follower mode, or source follower-only mode, according to the level of the differential voltage signals. When the differential amplifier operates, a constant current generated by the current source flows through the differential amplifier. As a result, differential voltage signals at a prescribed level are output from the first output terminal and second output terminal. When the source follower does not operate, differential voltage signals at a higher level than the input differential voltage signals are output from the first output terminal and second output terminal. In this way, the first signal conversion circuit of this invention comprises an NMOS transistor differential amplifier and a PMOS transistor source follower, so that fast operation using rail-to-rail input is possible. Further, the first signal conversion circuit of this invention, comprising a differential amplifier and a source follower, is formed from a smaller number of devices compared with a circuit comprising two differential amplifiers, so that the circuit area can be reduced and current consumption can be decreased.

A second signal conversion circuit of this invention is a signal conversion circuit which takes as input differential voltage signals to a first input terminal and a second input terminal, converts the common-mode voltage level of the differential voltage signals, and outputs differential voltage signals, with the common-mode voltage level converted, from a first output terminal and a second output terminal, and is characterized by comprising: (1) a first resistor, one end of which is connected to a low-potential side of a power supply, and the other end of which is connected to the first output terminal; (2) a second resistor, one end of which is connected to the low-potential side of the power supply, and the other end of which is connected to the second output terminal; (3) a first PMOS transistor, having a drain electrode connected to the first output terminal, a gate electrode connected to the second input terminal, and a source electrode; (4) a second PMOS transistor, having a drain electrode connected to the second output terminal, a gate electrode connected to the first input terminal, and a source electrode; (5) a first NMOS transistor, having a source electrode connected to the first output terminal, a gate electrode connected to the first input terminal, and a drain electrode connected to a high-potential side of the power supply; (6) a second NMOS transistor, having a source electrode connected to the second output terminal, a gate electrode connected to the second input terminal, and a drain electrode connected to the high-potential side of the power supply; and (7) a current source, which is provided between the source electrode of the first PMOS transistor and source electrode of the second PMOS transistor on the one hand, and the high-potential side of the power supply on the other, and which generates a constant current.

In this second signal conversion circuit, the first resistor, second resistor, first PMOS transistor, and second PMOS transistor form a differential amplifier. And, the first NMOS transistor and second NMOS transistor act as a source follower Differential voltage signals are input to the differential amplifier and source follower from the first input terminal and second input terminal. Similarly to the first signal conversion circuit described above, compared with a circuit comprising two differential amplifiers, the differential amplifier and source follower can be configured from fewer components, so that circuit area is reduced and the current consumption can be reduced. Also, the first NMOS transistor and second NMOS transistor which serve as the source follower amplify voltage signals without inversion, so that high-speed operation is possible.

A third signal conversion circuit of this invention is a signal conversion circuit which takes as input differential voltage signals to a first input terminal and a second input terminal, converts the common-mode voltage level of the differential voltage signals, and outputs differential voltage signals, with the common-mode voltage level converted, from a first output terminal and a second output terminal, and is characterized by comprising: (1) a first resistor, one end of which is connected to a high-potential side of a power supply, and the other end of which is connected to the first output terminal; (2) a second resistor, one end of which is connected to the high-potential side of the power supply, and the other end of which is connected to the second output terminal; (3) a first NMOS transistor, having a drain electrode connected to the first output terminal, a gate electrode connected to the second input terminal, and a source electrode; (4) a second NMOS transistor, having a drain electrode connected to the second output terminal, a gate electrode connected to the first input terminal, and a source electrode; (5) a third NMOS transistor, having a drain electrode connected to the first output terminal, a gate electrode to which a first bias voltage is input, and a source electrode; (6) a fourth NMOS transistor, having a drain electrode connected to the second output terminal, a gate electrode to which the first bias voltage is input, and a source electrode; (7) a first PMOS transistor, having a source electrode connected to the source electrode of the third NMOS transistor, a gate electrode connected to the first input terminal, and a drain electrode connected to a low-potential side of the power supply; (8) a second PMOS transistor, having a source electrode connected to the source electrode of the fourth NMOS transistor, a gate electrode connected to the second input terminal, and a drain electrode connected to the low-potential side of the power supply; and (9) a current source, which is provided between the source electrode of the first NMOS transistor and source electrode of the second NMOS transistor on the one hand, and the low-potential side of the power supply on the other, and which generates a constant current.

In this third signal conversion circuit also, a differential amplifier formed from the first resistor, second resistor, first NMOS transistor, and second NMOS transistor, and a source follower formed from the first PMOS transistor, second PMOS transistor, third NMOS transistor, and fourth NMOS transistor, are comprised, so that similarly to the above-described first signal conversion circuit, operations is possible in either a differential amplifier-only mode, or both differential amplifier and source follower mode, or source follower-only mode, according to the level of the differential voltage signals input to the first input terminal and second input terminal. Hence by means of this third signal conversion circuit, fast operation using rail-to-rail input is possible. Further, this third signal conversion circuit also is formed from a smaller number of devices compared with a circuit comprising two differential amplifiers, so that the circuit area can be reduced and current consumption can be decreased.

In the source follower, when the level of the differential voltage signal input to the first input terminal rises and the level of the differential voltage signal input to the second input terminal falls, non-inverting amplification is performed by the first PMOS transistor and second PMOS transistor, the differential voltage signal level output from the first output terminal rises, and the differential voltage signal level output from the second output terminal falls. When the level of the differential voltage signal output from the first output terminal, that is, the drain voltage of the third NMOS transistor, rises, the source voltage of the third NMOS transistor also rises. Then, because the gate voltage of the third NMOS transistor is fixed by the first bias voltage, the currents flowing in the first PMOS transistor and third NMOS transistor decrease, and the voltage drop across the first resistor decreases. As a result, the level of the differential voltage signal output from the first output terminal rises further. On the other hand, when the level of the differential voltage signal output from the second output terminal, that is, the drain voltage of the fourth NMOS transistor, falls, the source voltage of the fourth NMOS transistor also falls. Then, because the gate voltage of the fourth NMOS transistor is fixed by the first bias voltage, the currents flowing in the second PMOS transistor and in the fourth NMOS transistor increase, and the voltage drop across the second resistor increases. As a result, the level of the differential voltage signal output from the second output terminal falls further. In this way, through the action of the third NMOS transistor and fourth NMOS transistor in the source follower, the non-inverting amplification is intensified, and the non-inverting amplification gain is increased.

Hence by means of this third signal conversion circuit, the gain can be increased without increasing the resistance value of the first resistor or the resistance value of the second resistor. Also, by means of this third signal conversion circuit, the gain can be increased through an increase in current, that is, an increase in transistor size (gate width/gate length), without increasing the mutual conductances of the transistors of the differential amplifier (first NMOS transistor and second NMOS transistor) or of the source follower transistors (first PMOS transistor and second PMOS transistor). Hence by means of the third signal conversion circuit, the gain can be increased while suppressing reductions in high-speed characteristics, increases in circuit area and increases in power consumption, so that declines in the signal quality of differential voltage signals can be reduced.

A fourth signal conversion circuit of the invention is the above-described third signal conversion circuit, characterized by further comprising: (10) a third PMOS transistor, having a source electrode connected to the first output terminal, a gate electrode connected to the first input terminal, and a drain electrode; (11) a fourth PMOS transistor, having a source electrode connected to the second output terminal, a gate electrode connected to the second input terminal, and a drain electrode; (12) a fifth NMOS transistor, having a drain electrode connected to the drain electrode of the third PMOS transistor, a gate electrode to which a second bias voltage is input, and a source electrode connected to the low-potential side of the power supply; and (13) a sixth NMOS transistor, having a drain electrode connected to the drain electrode of the fourth PMOS transistor, a gate electrode to which the second bias voltage is input, and a source electrode connected to the low-potential side of the power supply.

This fourth signal conversion circuit comprises, in addition to a first source follower formed from the first PMOS transistor, second PMOS transistor, third NMOS transistor, and fourth NMOS transistor, to perform the above-described amplification with a non-inverting amplification gain, a second source follower formed from the third PMOS transistor, fourth PMOS transistor, fifth NMOS transistor, and sixth NMOS transistor, for non-inverting amplification.

In order to perform amplification with a non-inverting amplification gain in the first source follower, the third NMOS transistor and fourth NMOS transistor are inserted on the high-potential sides of the first PMOS transistor and second PMOS transistor respectively, so that the upper limit of the differential voltage signal level at which operation is possible is lower than the first bias voltage value (for example, the high-potential side power supply voltage value) by an amount equal to the sum of the NMOS transistor threshold value and the PMOS transistor threshold value. Here, when a decline in the power supply voltage accompanying reduced power consumption, an increase in the threshold values of transistors accompanying rises in junction temperatures, or similar occurs, the upper limit of the operable differential voltage signal level for the first source follower may become equal to or less than the threshold value of NMOS transistors, which is the lower limit of the operable differential voltage signal level of the differential amplifier. That is, there is the possibility that a mode in which both the differential amplifier and the first source follower operate does not exist.

On the other hand, in the second source follower, the fifth NMOS transistor and sixth NMOS transistor are inserted on the low-potential sides of the third PMOS transistor and the fourth PMOS transistor respectively, so that the upper limit of the differential voltage signal level at which operation is possible is reduced from the second bias voltage value (for example, the high-potential side of the power supply voltage) by an amount equal to the PMOS transistor threshold value. Here, a necessary condition of a CMOS device is the ability to configure a logic circuit such as for example an inverter, and so the power supply voltage value is larger than the sum of the NMOS transistor threshold value and the PMOS transistor threshold value. Hence in the second source follower, even when a decline in power supply voltage or an increase in transistor threshold values or similar occur, the upper limit of the operable differential voltage signal level does not become equal to or less than the lower limit of the operable differential voltage signal level for the differential amplifier. That is, there exists a mode in which the differential amplifier and the second source follower both operate. Hence by means of the fourth signal conversion circuit, the gain can be made large through the action of the first source follower, and rail-to-rail input operation is possible through the action of the second source follower.

A fifth signal conversion circuit of this invention is a signal conversion circuit which takes as input differential voltage signals to a first input terminal and a second input terminal, converts the common-mode voltage level of the differential voltage signals, and outputs differential voltage signals, with the common-mode voltage level converted, from a first output terminal and a second output terminal, and is characterized by comprising: (1) a first resistor, one end of which is connected to a low-potential side of a power supply, and the other end of which is connected to the first output terminal; (2) a second resistor, one end of which is connected to the low-potential side of a power supply, and the other end of which is connected to the second output terminal; (3) a first PMOS transistor, having a drain electrode connected to the first output terminal, a gate electrode connected to the second input terminal, and a source electrode; (4) a second PMOS transistor, having a drain electrode connected to the second output terminal, a gate electrode connected to the first input terminal, and a source electrode; (5) a third PMOS transistor, having a drain electrode connected to the first output terminal, a gate electrode to which a first bias voltage is input, and a source electrode; (6) a fourth PMOS transistor, having a drain electrode connected to the second output terminal, a gate electrode to which the first bias voltage is input, and a source electrode; (7) a first NMOS transistor, having a source electrode connected to the source electrode of the third PMOS transistor, a gate electrode connected to the first input terminal, and a drain electrode connected to a high-potential side of the power supply; (8) a second NMOS transistor, having a source electrode connected to the source electrode of the fourth PMOS transistor, a gate electrode connected to the second input terminal, and a drain electrode connected to the high-potential side of the power supply; and (9) a current source, which is provided between the source electrode of the first PMOS transistor and source electrode of the second PMOS transistor on the one hand, and the high-potential side of the power supply on the other, and which generates a constant current.

In this fifth signal conversion circuit also, a differential amplifier formed by the first resistor, second resistor, first PMOS transistor, and second PMOS transistor, as well as a source follower formed by the first NMOS transistor, second NMOS transistor, third PMOS transistor, and fourth PMOS transistor, are comprised, so that similarly to the above-described second signal conversion circuit, operation is in either a differential amplifier-only mode, or both differential amplifier and source follower mode, or source follower-only mode, according to the level of the differential voltage signals input to the first input terminal and second input terminal. Hence by means of this fifth signal conversion circuit, high-speed operation with rail-to-rail input is possible. Further, this fifth signal conversion circuit is also configured using fewer components than a circuit comprising two differential amplifiers, so that circuit area can be reduced and current consumption can be decreased.

When, in the source follower, the level of the differential voltage signal input to the first input terminal falls and the level of the differential voltage signal input to the second input terminal rises, non-inverting amplification is performed by the first NMOS transistor and second NMOS transistor, so that the level of the differential voltage signal output from the first output terminal falls, and the level of the differential voltage signal output from the second output terminal rises. When the level of the differential voltage signal output from the first output terminal, that is, the drain voltage of the third PMOS transistor, falls, the source voltage of the third PMOS transistor falls accordingly. Then, because the gate voltage of the third PMOS transistor is fixed by the first bias voltage, the currents flowing in the first NMOS transistor and third PMOS transistor decrease, and the voltage drop across the first resistor is reduced. As a result, the level of the differential voltage signal output from the first output terminal drops further. On the other hand, when there is a rise in the level of the differential voltage signal output from the second output terminal, that is, in the drain voltage of the fourth PMOS transistor, the source voltage of the fourth PMOS transistor rises accordingly. Then, because the gate voltage of the fourth PMOS transistor is fixed by the first bias voltage, the currents flowing in the second NMOS transistor and fourth PMOS transistor increase, and the voltage drop across the second resistor increases. As a result, the level of the differential voltage signal output from the second output terminal rises further. Thus in the source follower, non-inverting amplification is intensified and the non-inverting amplification gain is increased through the action of the third PMOS transistor and fourth PMOS transistor.

Hence by means of the fifth signal conversion circuit, the gain can be increased without increasing the resistance value of the first resistor or the resistance value of the second resistor. Also, by means of this fifth signal conversion circuit, the gain can be increased through an increase in current, that is, an increase in transistor size (gate width/gate length), without increasing the mutual conductances of the transistors of the differential amplifier (first PMOS transistor and second PMOS transistor) or of the source follower transistors (first NMOS transistor and second NMOS transistor). Hence by means of the fifth signal conversion circuit, the gain can be increased while suppressing reductions in high-speed characteristics, increases in circuit area and increases in power consumption, so that declines in the signal quality of differential voltage signals can be reduced.

A sixth signal conversion circuit of the invention is the above-described fifth signal conversion circuit, characterized by further comprising: (10) a third NMOS transistor, having a source electrode connected to the first output terminal, a gate electrode connected to the first input terminal, and a drain electrode; (11) a fourth NMOS transistor, having a source electrode connected to the second output terminal, a gate electrode connected to the second input terminal, and a drain electrode; (12) a fifth PMOS transistor, having a drain electrode connected to the drain electrode of the third NMOS transistor, a gate electrode to which a second bias voltage is input, and a source electrode connected to the high-potential side of the power supply; and (13) a sixth PMOS transistor, having a drain electrode connected to the drain electrode of the fourth NMOS transistor, a gate electrode to which the second bias voltage is input, and a source electrode connected to the high-potential side of the power supply.

This sixth signal conversion circuit comprises, in addition to a first source follower formed from the first NMOS transistor, second NMOS transistor, third PMOS transistor, and fourth PMOS transistor, to perform the above-described amplification with a non-inverting amplification gain, a second source follower formed from the third NMOS transistor, fourth NMOS transistor, fifth PMOS transistor, and sixth PMOS transistor, for non-inverting amplification.

In order to perform amplification with a non-inverting amplification gain in the first source follower, the third PMOS transistor and fourth PMOS transistor are inserted on the low-potential sides of the first NMOS transistor and second NMOS transistor respectively, so that the lower limit of the differential voltage signal level at which operation is possible is higher than the first bias voltage value (for example, the low-potential side power supply voltage value) by an amount equal to the sum of the PMOS transistor threshold value and the NMOS transistor threshold value. Here, when a decline in the power supply voltage absolute value accompanying reduced power consumption, an increase in the threshold values of transistors accompanying rises in junction temperatures, or similar occurs, the lower limit of the operable differential voltage signal level for the first source follower may become equal to or greater than the threshold value of PMOS transistors, which is the upper limit of the operable differential voltage signal level of the differential amplifier. That is, there is the possibility that a mode in which both the differential amplifier and the first source follower operate does not exist.

On the other hand, in the second source follower, the fifth PMOS transistor and sixth PMOS transistor are inserted on the high-potential sides of the third NMOS transistor and the fourth NMOS transistor respectively, so that the lower limit of the differential voltage signal level at which operation is possible is higher than the second bias voltage value (for example, the low-potential side of the power supply voltage) by an amount equal to the NMOS transistor threshold value. Here, a necessary condition of a CMOS device is the ability to configure a logic circuit such as for example an inverter, and so the power supply voltage absolute value is larger than the sum of the NMOS transistor threshold value and the PMOS transistor threshold value. Hence in the second source follower, even when a decline in power supply voltage absolute value or an increase in transistor threshold values or similar occur, the lower limit of the operable differential voltage signal level does not become equal to or greater than the upper limit of the operable differential voltage signal level for the differential amplifier. That is, there exists a mode in which the differential amplifier and the second source follower both operate. Hence by means of the sixth signal conversion circuit, the gain can be made large through the action of the first source follower, and rail-to-rail input operation is possible through the action of the second source follower.

As explained above, by means of a signal conversion circuit of this invention, the circuit area can be decreased while reducing current consumption, and higher-speed operation becomes possible.

EXPLANATION OF SYMBOLS

Figure 1:
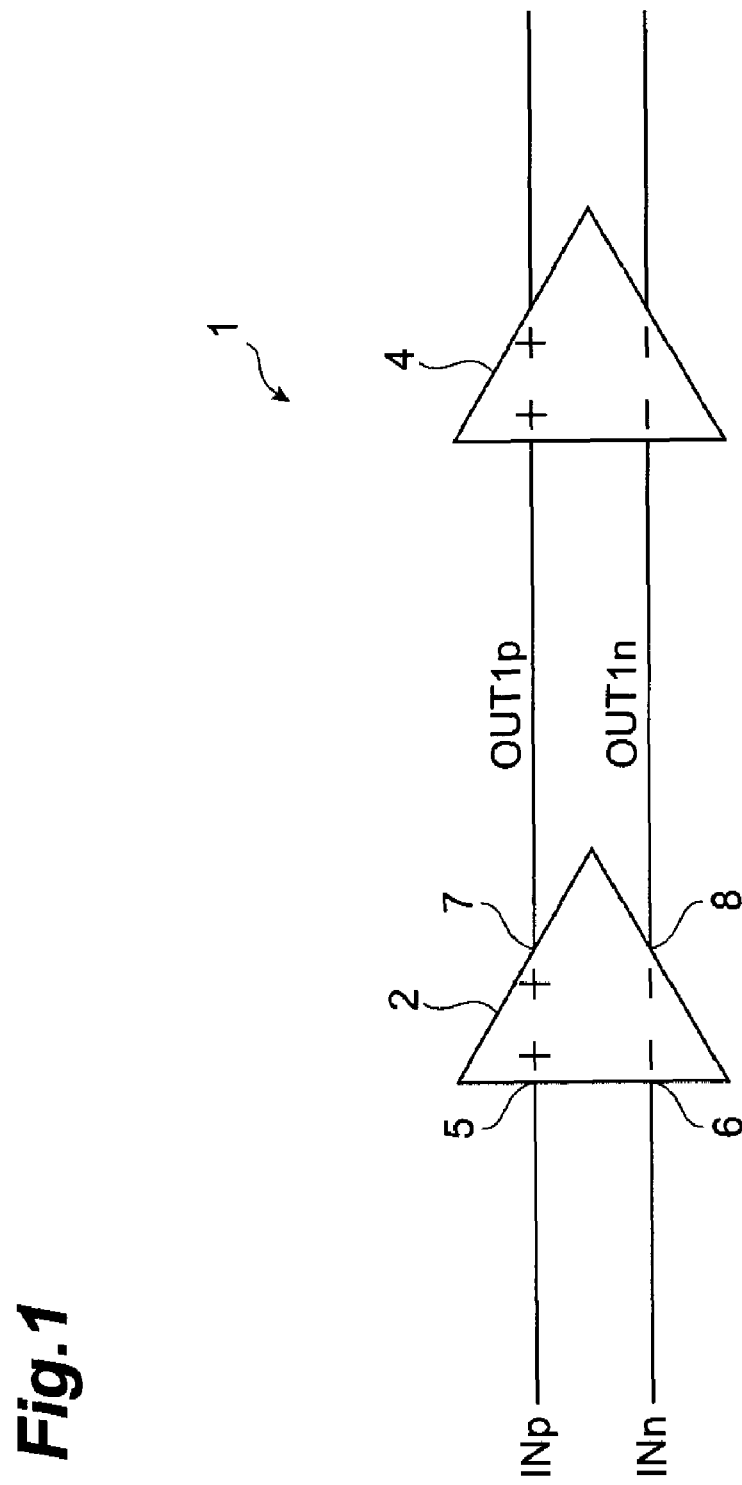
FIG. 1 shows the configuration of a rail-to-rail type differential amplifier circuit comprising the signal conversion circuit of a first embodiment of the invention.

1 Rail-to-rail circuit
2, 30, 2A, 2B, 30A, 30B Signal conversion circuit
4 Differential amplifier circuit
5 First input terminal
6 Second input terminal
7 First output terminal
8 Second output terminal
10, 40 Differential amplifier portion
11, 41 First resistor
12, 42 Second resistor 14, 52 First NMOS transistor
16, 54 Second NMOS transistor
18, 48 Current source
20, 50, 20A, 20B, 50A, 50B Source follower portion
22, 44 First PMOS transistor
24, 46 Second PMOS transistor
23, 58 Third NMOS transistor
25, 59 Fourth NMOS transistor
26, 53 Third PMOS transistor
27, 55 Fourth PMOS transistor
28 Fifth NMOS transistor
29 Sixth NMOS transistor
56 Fifth PMOS transistor
57 Sixth PMOS transistor
INp, INn differential voltage signals
OUT1p, OUT1n, OUT2p, OUT2n Differential voltage signals

BEST MODE FOR CARRYING OUT THE INVENTION

Next, embodiments of signal conversion circuits of the invention are explained, referring to the attached drawings. Where possible, the same symbols are assigned to the same portions.

First Embodiment

FIG. 1 shows the configuration of a rail-to-rail type differential amplifier circuit, comprising the signal conversion circuit of a first embodiment of the invention. This rail-to-rail circuit 1 is a differential amplifier circuit which acquires input signals over a broad range of common-mode voltages, performs prescribed amplification and outputs the result, and is for example used in LVDS reception device. The rail-to-rail circuit 1 comprises a signal conversion circuit 2, which converts the common-mode voltage level of input differential voltage signals, and a differential amplifier circuit 4 which amplifies the converted differential voltage signals converted to a prescribed common-mode voltage level.

Differential voltage signals INp and INn are input to the first input terminal 5 and second input terminal 6 respectively of the signal conversion circuit 2. The signal conversion circuit 2 converts the common-mode voltage level of the differential voltage signals INp and INn to a prescribed common-mode voltage level, and outputs the differential voltage signals OUT1p and OUT1n from the first output terminal 7 and second output terminal 8 respectively. The differential amplifier circuit 4 acquires the differential voltage signals OUT1p and OUT1n, performs voltage amplification, and outputs the amplified differential voltage signals OUT1p and OUT1n.

Figure 2:
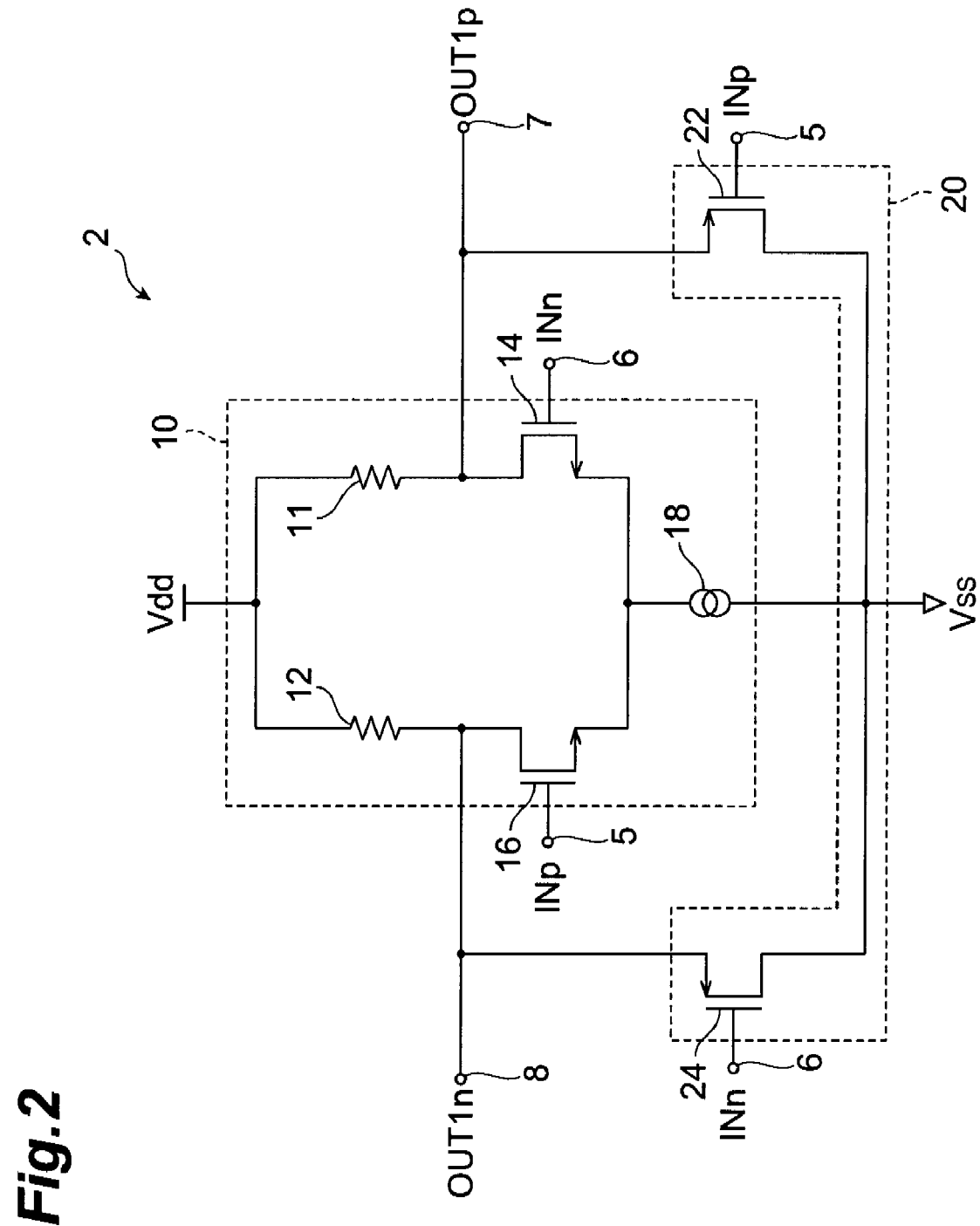
FIG. 2 is a circuit diagram of the signal conversion circuit of the first embodiment of the invention.

FIG. 2 is a circuit diagram of the signal conversion circuit 2 of the first embodiment of the invention. The signal conversion circuit 2 has a differential amplifier portion 10 which performs differential amplification, and a source follower portion 20 which operates as a source follower.

The differential amplifier portion 10 comprises a first NMOS transistor 14 and second NMOS transistor 16, and further has a first resistor 11, second resistor 12, and current source 18. One end of the first resistor 11 is connected to the high-potential side of a power supply Vdd, and the other end is connected to the first output terminal 7. One end of the second resistor 12 is connected to the high-potential side of the power supply Vdd, and the other end is connected to the second output terminal 8. The drain of the first NMOS transistor 14 is connected to the first output terminal 7, the source electrode is connected to the current source 18, and the gate electrode is connected to the second input terminal 6. The drain electrode of the second NMOS transistor 16 is connected to the second output terminal 8, the source electrode is connected to the current source 18, and the gate electrode is connected to the first input terminal 5. The current source 18 is provided between the source electrode of the first NMOS transistor 14 and source electrode of the second NMOS transistor 16 on the one hand, and the low-potential side of the power supply Vss on the other, and generates a constant current Iss.

The source follower portion 20 has a first PMOS transistor 22 and second PMOS transistor 24, which operate as a source follower. More specifically, the source electrode of the first PMOS transistor 22 is connected to the first output terminal 7, the gate electrode is connected to the first input terminal 5, and the drain electrode is connected to the low-potential side of the power supply Vss. The source electrode of the second PMOS transistor 24 is connected to the second output terminal 8, the gate electrode is connected to the second input terminal 6, and the drain is connected to the low-potential side power supply Vss. In FIG. 2, for convenience, the first input terminal 5 to which the gate electrode of the second NMOS transistor 16 is connected is shown separately from the first input terminal 5 to which the gate electrode of the first PMOS transistor 22 is connected; but the terminals are the same terminal. A similar remark applies to the second input terminal 6 to which the gate electrode of the first NMOS transistor 14 is connected and the second input terminal 6 to which the gate electrode of the second PMOS transistor 24 is connected.

Figure 3:
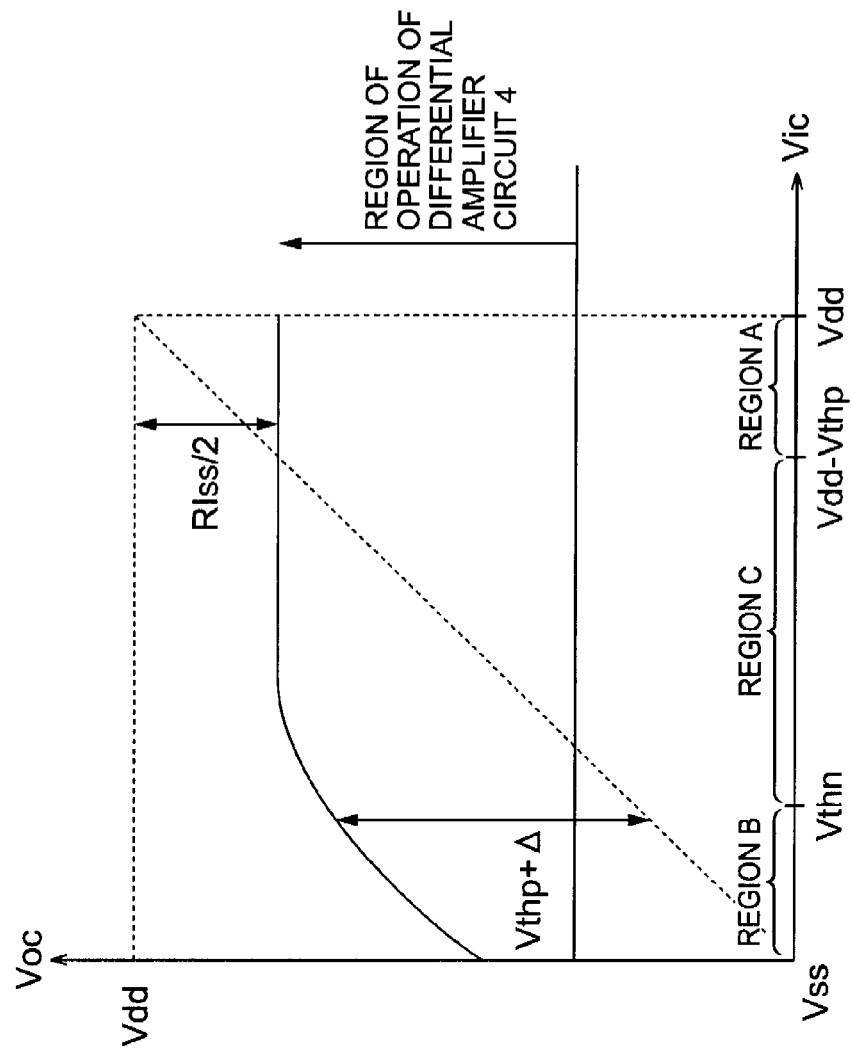
FIG. 3 is a graph showing the relation between input common-mode voltage and output common-mode voltage for a signal conversion circuit.

Next, operation of the signal conversion circuit 2 is explained. FIG. 3 is a graph showing the relation between the input common-mode voltage and the output common-mode voltage in the signal conversion circuit 2. Here, the resistance value of the first resistor 11 and second resistor 12 is denoted by R. Also, the threshold value of the first NMOS transistor 14 and second NMOS transistor 16 is Vthn, and the threshold value of the first PMOS transistor 22 and second PMOS transistor 24 is Vthp. And, the input common-mode voltage level for the differential voltage signal INp input to the first input terminal 5 and differential voltage signal INn input to the second input terminal 6 is Vic, while the output common-mode voltage level for the differential voltage signal OUT1p output from the first output terminal 7 and the differential voltage signal OUT1n output from the second output terminal 8 is Voc. The signal conversion circuit 2 operates differently in each of the following regions: (i) region A, for which the input common-mode voltage level Vic is equal to or greater than Vdd−Vthp and equal to or less than Vdd; (ii) region B, in which the input common-mode voltage level Vic is equal to or greater than Vss and equal to or less than Vthn; and (iii) region C, in which the input common-mode voltage level Vic is equal to or greater than Vthn and equal to or less than Vdd—Vthp. Below, operation of the signal conversion circuit 2 in each of these regions is explained.

(i) When the input common-mode voltage level Vic is equal to or greater than Vdd−Vthp and equal to or less than Vdd (region A), the first NMOS transistor 14 and second NMOS transistor 16 of the differential amplifier portion 10 operate, and the source follower portion 20 does not operate. In this case, the output common-mode voltage level Voc can be represented by equation (1) below.

$$V_{oc} = V_{dd} - \frac{RI_{ss}}{2} \tag{1}$$

Differential voltage signals OUT1p and OUT1n with the above-described common-mode voltage level are output from the first output terminal 7 and second output terminal 8 respectively.

(ii) When the input common-mode voltage level Vic is equal to or greater than Vss and equal to or less than Vthn (region B), the first PMOS transistor 22 and second PMOS transistor 24 of the source follower portion 20 operate, but the differential amplifier portion 10 does not operate. In this case, because the first PMOS transistor 22 and second PMOS transistor 24 form the source follower circuit, the output common-mode voltage level Voc can be represented by equation (2) below.

$$Voc = Vdd - RI = \Delta + Vic + Vthp \quad (2)$$

Here, Δ is the overdrive voltage of the first PMOS transistor 22 or second PMOS transistor 24 to which differential voltage signals with the above-described level have been input, and I is the value of the current flowing from the drain electrode side to the source electrode side of the PMOS transistors. The differential voltage signals OUT1p and OUT1n with the above-described common-mode voltage level are output from the first output terminal 7 and second output terminal 8 respectively. The current I can be represented by equation (3) below.

$$I = \frac{\beta p \Delta^2}{2} \quad (3)$$

Here, βp is the current amplification factor. From equation (2) and equation (3), the overdrive voltage Δ can be expressed by equation (4) below.

$$\Delta = \frac{\sqrt{1 + 2R\beta p(Vdd - Vic - Vthp)} - 1}{R\beta p} \quad (4)$$

(iii) When the input common-mode voltage level Vic is equal to or greater than Vthn and equal to or less than Vdd—Vthp (region C), both the differential amplifier portion 10 and the source follower portion 20 operate. That is, the differential amplifier portion 10 and source follower portion 20 supply to the first output terminal 7 the same sign and displacement voltage as the input signal, supply to the second output terminal 8 the same sign and displacement voltage as the input signal, and generate in concert the differential voltage signals OUT1p and OUT1n at the first output terminal 7 and second output terminal 8. The output common-mode voltage level Voc is determined by these differential voltage signals OUT1p and OUT1n.

In the signal conversion circuit 2, the size and values of the current source 18, first resistor 11, second resistor 12, first NMOS transistor 14, second NMOS transistor 16, first PMOS transistor 22, and second PMOS transistor 24 are adjusted such that the above-described equations (1) through (4) are satisfied, and moreover such that the output common-mode voltage level Voc falls within the operating region of the differential amplifier circuit 4.

As explained above, when differential voltage signals INp and INn are input to the first input terminal 5 and second input terminal 6 respectively of the signal conversion circuit 2, operation occurs in either a mode of operation of the differential amplifier portion 10 only, or of operation of both the differential amplifier portion 10 and the source follower portion 20, or of operation of only the source follower portion 20, according to the input common-mode voltage level Vic, that is, the level of the differential voltage signals INp and INn. When the input common-mode voltage level Vic fluctuates at the boundary between region A in which only the differential amplifier portion 10 operates and region C in which the differential amplifier portion 10 and the source follower portion 20 operate, that is, in the vicinity of Vdd–Vthp, as the operation of either the differential amplifier portion 10 or of the source follower portion 20 intensifies, the operation of the other portion weakens. When the input common-mode voltage level Vic fluctuates at the boundary between region B in which only the source follower portion 20 operates and region C in which the differential amplifier portion 10 and the source follower portion 20 operate, that is, in the vicinity of the voltage Vthn, as the operation of either the differential amplifier portion 10 or of the source follower portion 20 intensifies, the operation of the other portion weakens. Hence with changes in the input common-mode voltage level Vic from Vss to Vdd, a smooth and continuous output common-mode voltage level Voc can be obtained.

Compared with a circuit comprising two differential amplifier circuits, the differential amplifier portion 10 and source follower portion 20 comprised by the signal conversion circuit 2 have fewer components, so that circuit area is smaller and current consumption can be reduced. Further, the first PMOS transistor 22 and second PMOS transistor 24 of the source follower portion 20 perform non-inverting amplification of the differential voltage signals INp and INn, so that the load capacitance is smaller and faster operation is possible than for an inverting-amplification circuit. And, the source follower operation speed does not depend on the size of the first PMOS transistor 22 or second PMOS transistor 24, so that the sizes of the first PMOS transistor 22 and second PMOS transistor 24 can be reduced while maintaining fast circuit operation. As a result, a signal conversion circuit 2 with reduced input capacitance and capable of fast operation can be realized.

Second Embodiment

Figure 4:
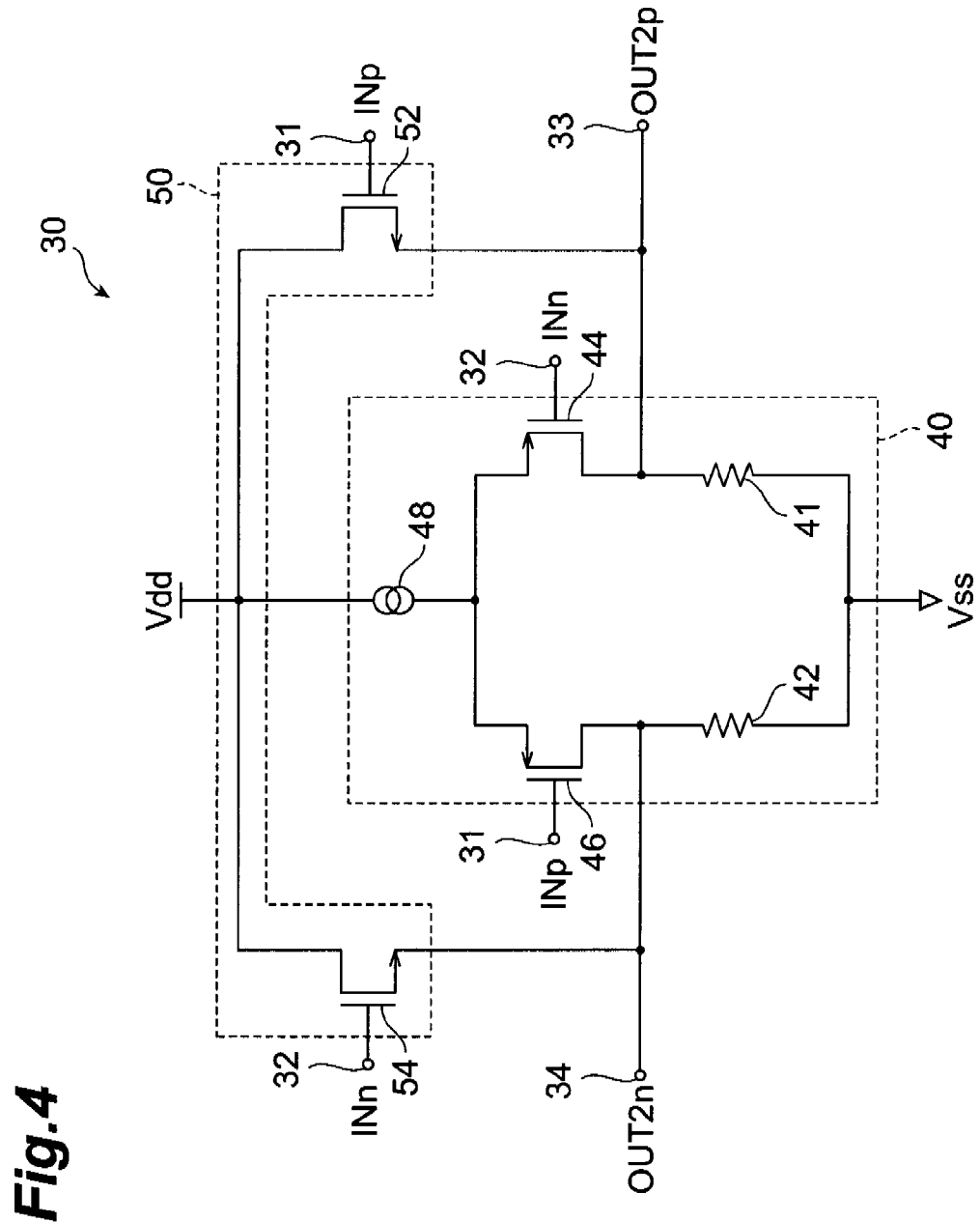
FIG. 4 is a circuit diagram of the signal conversion circuit of a second embodiment of the invention.

Next, a second embodiment of the invention is explained. FIG. 4 is a circuit diagram of the signal conversion circuit of the second embodiment of the invention. Similarly to the above-described signal conversion circuit 2, the signal conversion circuit 30 is a circuit used in rail-to-rail type differential amplification circuits, and converts the common-mode voltage level of input differential voltage signals into a prescribed common-mode voltage level. The differential voltage signals INp and INn are input to a first input terminal 31 and second input terminal 32, respectively, of the signal conversion circuit 30. The signal conversion circuit 30 converts the common-mode voltage level of the differential voltage signals INp and INn to the prescribed common-mode voltage level, and outputs the differential voltage signals OUT2p and OUT2n to the first output terminal 33 and second output terminal 34, respectively. The differential amplification circuit 4 shown in FIG. 1 acquires the differential voltage signals OUT2p and OUT2n, performs voltage amplification, and outputs the amplified differential voltage signals OUT2p and OUT2n.

The signal conversion circuit 30 is formed on a p-type semiconductor substrate, and has a differential amplifier portion 40 which performs differential amplification operation, and a source follower portion 50 which operates as a source follower.

The differential amplifier portion 40 comprises a first PMOS transistor 44 and second PMOS transistor 46, and further has a first resistor 41, second resistor 42, and current source 48. One end of the first resistor 41 is connected to the low-potential side of a power supply Vss, and the other end is connected to the first output terminal 33. One end of the second resistor 42 is connected to the low-potential side of the power supply Vss, and the other end is connected to the second output terminal 34. The drain electrode of the first PMOS transistor 44 is connected to the first output terminal 33, the source electrode is connected to the current source 48, and the gate electrode is connected to the second input terminal 32. The drain electrode of the second PMOS transistor 46 is connected to the second output terminal 34, the source electrode is connected to the current source 48, and the gate electrode is connected to the first input terminal 31. The current source 48 is provided between the source electrode of the first PMOS transistor 44 and source electrode of the second PMOS transistor 46 on the one hand, and the high-potential side of the power supply Vdd on the other, and generates a constant current Iss.

The source follower portion 50 has a first NMOS transistor 52 and second NMOS transistor 54, which operate as a source follower. More specifically, the source electrode of the first NMOS transistor 52 is connected to the first output terminal 33, the gate electrode is connected to the first input terminal 31, and the drain electrode is connected to the high-potential side of the power supply Vdd. The source electrode of the second NMOS transistor 54 is connected to the second output terminal 34, the gate electrode is connected to the second input terminal 32, and the drain electrode is connected to the high-potential side of the power supply Vdd. In FIG. 4, for convenience, the first input terminal 31 to which the gate electrode of the second PMOS transistor 46 is connected is shown separately from the first input terminal 31 to which the gate electrode of the first NMOS transistor 52 is connected; but the terminals are the same terminal. A similar remark applies to the second input terminal 32 to which the gate electrode of the first PMOS transistor 44 is connected and the second input terminal 32 to which the gate electrode of the second NMOS transistor 54 is connected.

Next, operation of the signal conversion circuit 30 is explained. Here, the resistance value of the first resistor 41 and second resistor 42 is denoted by R. Also, the threshold value of the first PMOS transistor 44 and second PMOS transistor 46 is Vthp, and the threshold value of the first NMOS transistor 52 and second NMOS transistor 54 is Vthn. And, the input common-mode voltage level for the differential voltage signal INp input to the first input terminal 31 and differential voltage signal INn input to the second input terminal 32 is Vic, while the output common-mode voltage level for the differential voltage signal OUT2p output from the first output terminal 33 and the differential voltage signal OUT2n output from the second output terminal 34 is Voc. The signal conversion circuit 30 operates differently in each of the following regions: (i) the region in which the input common-mode voltage level Vic is equal to or greater than Vss and equal to or less than Vthn; (ii) the region in which the input common-mode voltage level Vic is equal to or greater than Vdd−Vthp and equal to or less than Vdd; and (iii) the region in which the input common-mode voltage level Vic is equal to or greater than Vthn and equal to or less than Vdd−Vthp. Below, operation of the signal conversion circuit 30 in each of these regions is explained.

(i) When the input common-mode voltage level Vic is equal to or greater than Vss and equal to or less than Vthn, the first PMOS transistor 44 and second PMOS transistor 46 of the differential amplifier portion 40 operate, and the source follower portion 50 does not operate. In this case, the output common-mode voltage level Voc can be represented by equation (5) below.

$$Voc = \frac{RIss}{2} \quad (5)$$

Differential voltage signals OUT2p and OUT2n with the above-described common-mode voltage level are output from the first output terminal 33 and second output terminal 34 respectively.

(ii) When the input common-mode voltage level Vic is equal to or greater than Vdd−Vthp and equal to or less than Vdd, the first NMOS transistor 52 and second NMOS transistor 54 of the source follower portion 50 operate, but the differential amplifier portion 40 does not operate. In this case, because the first NMOS transistor 52 and second NMOS transistor 54 form the source follower circuit, the output common-mode voltage level Voc can be represented by equation (6) below.

$$Voc = RI = Vic - \Delta - Vthn \quad (6)$$

Here, $\Delta$ is the overdrive voltage of the first NMOS transistor 52 or second NMOS transistor 54 to which differential voltage signals with the above-described level have been input, and I is the value of the current flowing from the drain electrode side to the source electrode side of the NMOS transistors. The differential voltage signals OUT2p and OUT2n with the above-described common-mode voltage level are output from the first output terminal 33 and second output terminal 34 respectively. The current I can be represented by equation (7) below.

$$I = \frac{\beta n \Delta^2}{2} \quad (7)$$

Here, $\beta n$ is the current amplification factor. From equation (6) and equation (7), the overdrive voltage $\Delta$ can be expressed by equation (8) below.

$$\Delta = \frac{\sqrt{1 + 2R\beta n(Vic - Vthn)} - 1}{R\beta n} \quad (8)$$

(iii) When the input common-mode voltage level Vic is equal to or greater than Vthn and equal to or less than Vdd−Vthp, both the differential amplifier portion 40 and the source follower portion 50 operate. That is, the differential amplifier portion 40 and source follower portion 50 supply to the first output terminal 33 the same sign and displacement voltage as the input signal, supply to the second output terminal 34 the same sign and displacement voltage as the input signal, and generate in concert the differential voltage signals OUT2p and OUT2n at the first output terminal 33 and second output terminal 34. The output common-mode voltage level Voc is determined by these differential voltage signals OUT2p and OUT2n.

In the signal conversion circuit 30, the size and values of the current source 48, first resistor 41, second resistor 42, first PMOS transistor 44, second PMOS transistor 46, first NMOS transistor 52, and second NMOS transistor 54 are adjusted such that the above-described equations (5) through (8) are satisfied, and moreover such that the output common-mode voltage level Voc falls within the operating region of the differential amplifier circuit 4.

As explained above, when differential voltage signals INp and INn are input to the first input terminal 31 and second input terminal 32 respectively of the signal conversion circuit 30, operation occurs in either a mode of operation of the differential amplifier portion 40 only, or of operation of both the differential amplifier portion 40 and the source follower portion 50, or of operation of only the source follower portion 50, according to the input common-mode voltage level Vic, that is, the level of the differential voltage signals INp and INn. When the input common-mode voltage level Vic fluctuates at the boundary between the region in which only the differential amplifier portion 40 operates and the region in which the differential amplifier portion 40 and the source follower portion 50 operate, that is, in the vicinity of Vthn, as the operation of either the differential amplifier portion 40 or of the source follower portion 50 intensifies, the operation of the other portion weakens. When the input common-mode voltage level Vic fluctuates at the boundary between the region in which only the source follower portion 50 operates and the region in which the differential amplifier portion 40 and the source follower portion 50 operate, that is, in the vicinity of the voltage Vdd−Vthp, as the operation of either the differential amplifier portion 40 or of the source follower portion 50 intensifies, the operation of the other portion weakens. Hence with changes in the input common-mode voltage level Vic from Vss to Vdd, a smooth and continuous output common-mode voltage level Voc can be obtained.

Compared with a circuit comprising two differential amplifier circuits, the differential amplifier portion 40 and source follower portion 50 comprised by the signal conversion circuit 30 have fewer components, so that circuit area is smaller and current consumption can be reduced. Further, the first NMOS transistor 52 and second NMOS transistor 54 of the source follower portion 50 perform non-inverting amplification of the differential voltage signals INp and INn, so that the load capacitance is smaller and faster operation is possible than for an inverting-amplification circuit. And, the source follower operation speed does not depend on the size of the first NMOS transistor 52 or second NMOS transistor 54, so that the sizes of the first NMOS transistor 52 and second NMOS transistor 54 can be reduced while maintaining fast circuit operation. As a result, a signal conversion circuit 30 with reduced input capacitance and capable of fast operation can be realized.

Further, because the signal conversion circuit 30 is formed on a p-type semiconductor substrate, it is no longer necessary to consider the substrate bias effect on the first PMOS transistor 44 and second PMOS transistor 46. Hence the operable range of the differential amplifier portion 40 can be broadened, so that even when narrowing the operable range of the source follower portion 50, that is, when raising the threshold values of the first NMOS transistor 52 and second NMOS transistor 54 of the source follower portion 50, operation of the signal conversion circuit 30 can be adequately ensured. By raising the threshold values of the first NMOS transistor 52 and second NMOS transistor 54, the power consumed by the source follower portion 50 can be reduced. As a result, power consumption of the signal conversion circuit 30 can be further reduced.

Third Embodiment

Figure 5:
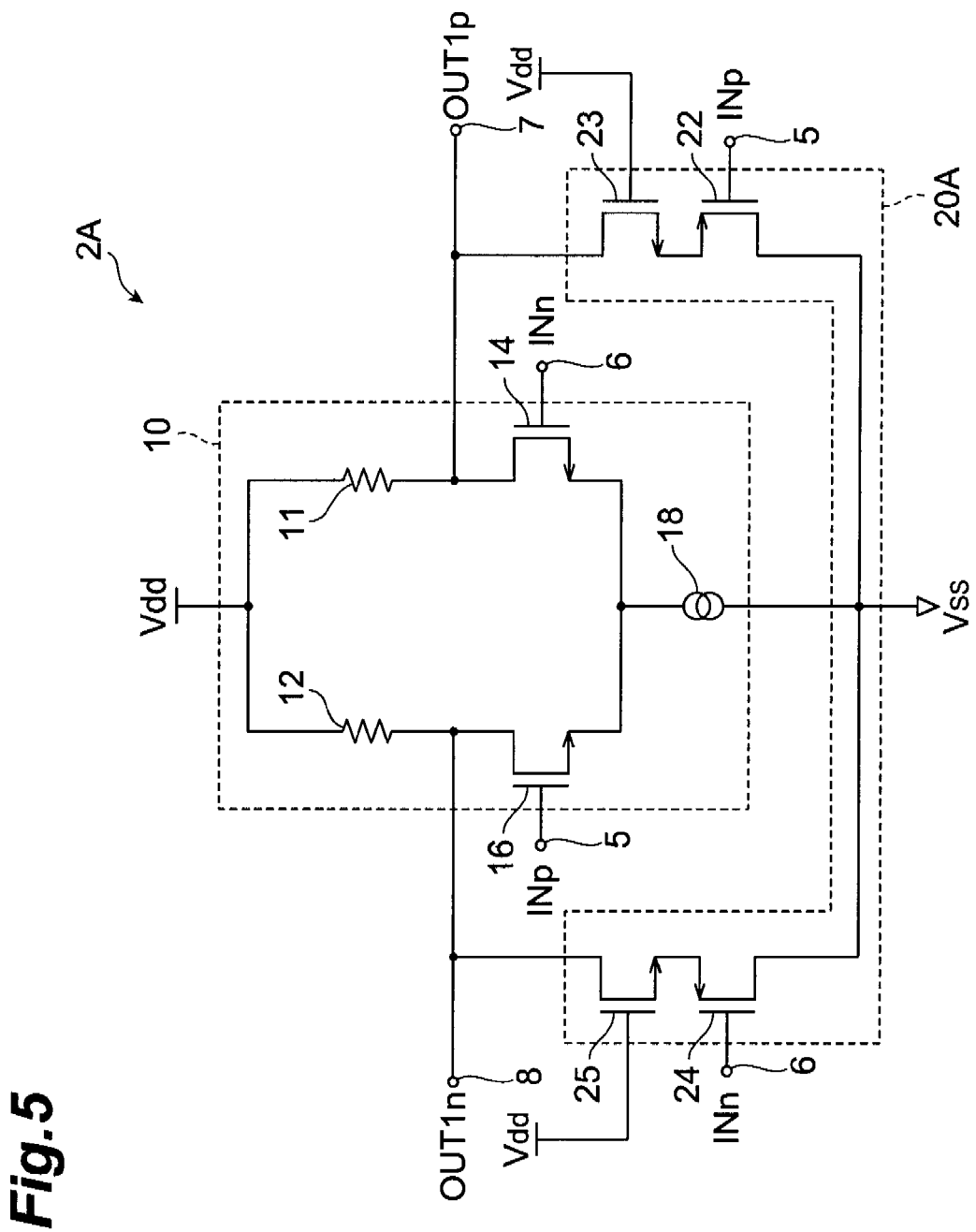
FIG. 5 is a circuit diagram of the signal conversion circuit of a third embodiment of the invention.

FIG. 5 is a circuit diagram showing the signal conversion circuit of a third embodiment of the invention. The signal conversion circuit 2A shown in FIG. 5 differs from the first embodiment in that, in place of the source follower portion 20 in the signal conversion circuit 2, the source follower portion 20A is comprised. Otherwise the configuration of signal conversion circuit 2A is similar to that of signal conversion circuit 2.

The source follower portion 20A differs from the source follower portion 20 in further comprising a third NMOS transistor 23 and fourth NMOS transistor 25. Otherwise the configuration of the source follower portion 20A is similar to that of the source follower portion 20.

The drain electrode of the third NMOS transistor 23 is connected to the first output terminal 7, and the source electrode of the third NMOS transistor 23 is connected to the source electrode of the first PMOS transistor 22. A first bias voltage is input to the gate electrode of the third NMOS transistor 23. In this embodiment, the first bias voltage is the voltage of the high-potential side of the power supply Vdd. The drain electrode of the first PMOS transistor 22 is connected to the low-potential side of the power supply Vss, and the gate electrode of the first PMOS transistor 22 is connected to the first input terminal 5.

Similarly, the drain electrode of the fourth NMOS transistor 25 is connected to the second output terminal 8, and the source electrode of the fourth NMOS transistor 25 is connected to the source electrode of the second PMOS transistor 24. The first bias voltage is input to the gate electrode of the fourth NMOS transistor 25. The drain electrode of the second PMOS transistor 24 is connected to the low-potential side of the power supply Vss, and the gate electrode of the second PMOS transistor 24 is connected to the second input terminal 6.

It is preferable that a back-gate electrode of the first PMOS transistor 22 be connected to the source electrode of the first PMOS transistor 22, and it is preferable that a back-gate electrode of the second PMOS transistor 24 be connected to the source electrode of the second PMOS transistor 24. By thus connecting back-gate electrodes of the PMOS transistors to the source electrodes, the change in turn-on resistance with voltage input to the gate electrode can be increased.

Next, operation of the signal conversion circuit 2A is explained. Similarly to the signal conversion circuit 2 of the first embodiment, the signal conversion circuit 2A operates as follows when differential voltage signals INp and INn are input to the first input terminal 5 and second input terminal 6 respectively, according to the input common-mode voltage level Vic, that is, according to the voltage levels of the differential voltage signals INp and INn. Here, Vthn2 is the threshold value of the third NMOS transistor 23 and fourth NMOS transistor 25.

(i) When the input common-mode voltage level Vic is equal to or greater than Vdd—Vthp—Vthn2 and equal to or less than Vdd (equivalent to region A in FIG. 3), the differential amplifier portion 10 operates, and the source follower portion 20A does not operate, so that the output common-mode voltage level Voc is determined by the differential amplifier portion 10.

(ii) When the input common-mode voltage level Vic is equal to or greater than Vss and equal to or less than Vthn (equivalent to region B in FIG. 3), the source follower portion 20A operates, and the differential amplifier portion 10 does not operate, so that the output common-mode voltage Voc is determined by the source follower portion 20A.

(iii) When the input common-mode voltage level Vic is equal to or greater than Vthn and equal to or less than Vdd—Vthp—Vthn2 (equivalent to region C in FIG. 3), the differential amplifier portion 10 and source follower portion 20A both operate, so that the output common-mode voltage level Voc is determined by both the differential amplifier portion 10 and by the source follower portion 20A.

Next, operation of the source follower portion 20A is explained in detail. When the source follower portion 20A is operating in the above-described regions (ii) and (iii), if the voltage level of the differential voltage signal INp input to the first input terminal 5 rises, the absolute value of the gate-source voltage of the first PMOS transistor 22 falls, and the drain-source turn-on resistance of the first PMOS transistor 22 increases. As a result, the current flowing between drain and source in the first PMOS transistor 22 and the current flowing between drain and source in the third NMOS transistor 23 decreases, and the voltage drop across the first resistor 11 decreases. As a result, the voltage level of the differential voltage signal OUT1p output from the first output terminal 7 rises.

On the other hand, the voltage level of the differential voltage signal INn input to the second input terminal 6 falls, so that the absolute value of the gate-source voltage of the second PMOS transistor 24 increases, and the drain-source turn-on resistance of the second PMOS transistor 24 falls. Hence the second PMOS transistor 24 drain-source current and the fourth NMOS transistor 25 drain-source current increases, and the voltage drop across the second resistor 12 increases. As a result, the voltage level of the differential voltage signal OUT1n output from the second output terminal 8 falls. In this way, non-inverting amplification is performed in the source follower portion 20A.

As explained above, when there is a rise in the voltage level of the differential voltage signal OUT1p output from the first output terminal 7, that is, in the drain voltage of the third NMOS transistor 23, the source voltage of the third NMOS transistor 23 rises accordingly, and the absolute value of the gate-source voltage of the third NMOS transistor 23 falls. Hence the drain-source turn-on resistance of the third NMOS transistor 23 increases, the first PMOS transistor 22 drain-source current and third NMOS transistor 23 drain-source current decline further, and the voltage drop across the first resistor 11 decreases further. As a result, the voltage level of the differential voltage signal OUT1p output from the first output terminal 7 rises further.

On the other hand, there is a drop in the voltage level of the differential voltage signal OUT1n output from the second output terminal 8, that is, in the drain voltage of the fourth NMOS transistor 25, so that there is an accompanying decline in the source voltage of the fourth NMOS transistor 25, and the absolute value of the gate-source voltage of the fourth NMOS transistor 25 increases. Hence the fourth NMOS transistor 25 drain-source turn-on resistance decreases, the second PMOS transistor 24 drain-source current and the fourth NMOS transistor 25 drain-source current further increase, and the voltage drop across the second resistor 12 further increases. As a result, the voltage level of the differential voltage signal OUT1n output from the second output terminal 8 further decreases. In this way, the non-inverting amplification is intensified by the source follower portion 20A, and the non-inverting amplification gain increases.

Similarly, when in the source follower portion 20A the voltage level of the differential voltage signal INp input to the first input terminal 5 decreases and the voltage level of the differential voltage signal INn input to the second input terminal 6 increases, non-inverting amplification is intensified such that the voltage level of the differential voltage signal OUT1p output from the first output terminal 7 decreases and the voltage level of the differential voltage signal OUT1n output from the second output terminal 8 increases.

Thus in the signal conversion circuit 2A of the third embodiment also, a differential amplifier portion 10 and source follower portion 20A are comprised, so that operation is possible in a mode in which only the differential amplifier portion 10 operates, or in a mode in which both the differential amplifier portion 10 and the source follower portion 20A operate, or in a mode in which only the source follower portion 20A operates, according to the voltage levels of the differential voltage signals input to the first input terminal 5 and second input terminal 6, and so advantages similar to those of the first embodiment can be obtained.

Further, in the signal conversion circuit 2A of the third embodiment, non-inverting amplification by the first PMOS transistor 22 and second PMOS transistor 24 in the source follower portion 20A is intensified by the action of the third NMOS transistor 23 and fourth NMOS transistor 25. Hence by means of the signal conversion circuit 2A of the third embodiment, the gain can be increased without increasing the resistance value of the first resistor 11 or the resistance value of the second resistor 12. Further, by means of the signal conversion circuit 2A of the third embodiment, the gain can be increased through an increase in current, that is, an increase in transistor size (gate width/gate length), without increasing the mutual conductance of the transistors of the differential amplifier portion 10 (first NMOS transistor 14 and second NMOS transistor 16) or of the transistors of the source follower portion 20A (first PMOS transistor 22 and second PMOS transistor 24). Hence by means of the signal conversion circuit 2A of the third embodiment, the gain can be increased without detracting from high-speed characteristics, and also without greatly increasing the circuit area or power consumption.

By means of a rail-to-rail circuit 1 comprising the signal conversion circuit 2A of this third embodiment, a signal conversion circuit 2A which is fast and has high gain can be provided in the input stage, so that degradation of the signal quality of differential voltage signals can be reduced. For example, the transition times (rise times and fall times) of differential voltage signals output from the rail-to-rail circuit 1 can be shortened. As a result, AC timing scattering in phases between synchronized signals can be reduced in serial/parallel conversion circuits, signal identification circuits, and similar in later stages of the rail-to-rail circuit 1. These advantageous results are important when there is degradation of the signal quality of differential voltage signals arising from reduced power consumption, that is, from lower voltages.

Fourth Embodiment

Figure 6:
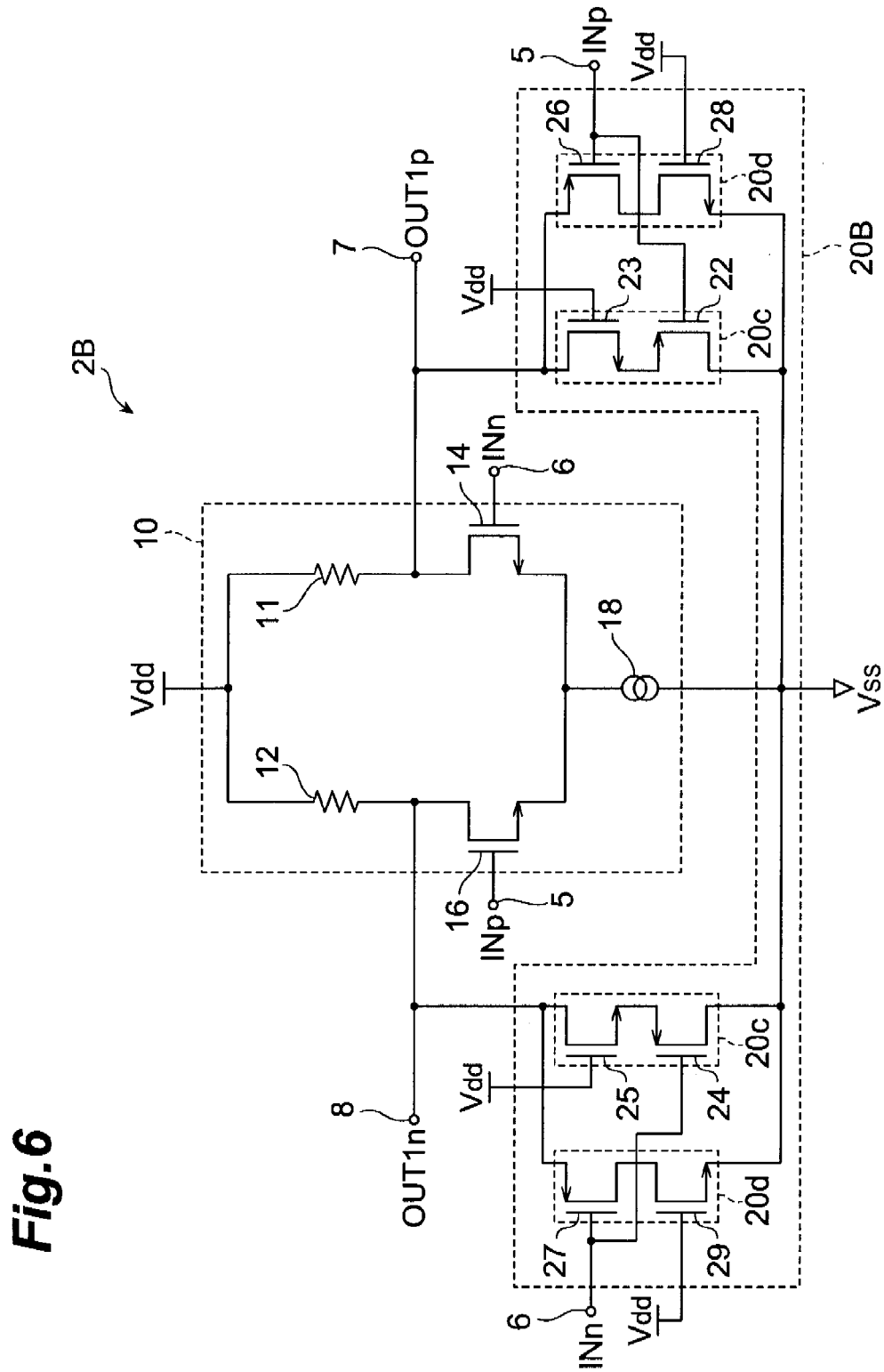
FIG. 6 is a circuit diagram of the signal conversion circuit of a fourth embodiment of the invention.

FIG. 6 is a circuit diagram showing the signal conversion circuit of a fourth embodiment of the invention. The signal conversion circuit 2B shown in FIG. 6 differs from the third embodiment in that, instead of the source follower portion 20A in the signal conversion circuit 2A, a source follower portion 20B is provided. Otherwise the configuration of the signal conversion circuit 2B is similar to that of the signal conversion circuit 2A.

The source follower portion 20B differs from the source follower portion 20A in further comprising a third PMOS transistor 26, fourth PMOS transistor 27, fifth NMOS transistor 28, and sixth NMOS transistor 29. Otherwise the configuration of the source follower portion 20B is similar to that of the source follower portion 20A.

The source electrode of the third PMOS transistor 26 is connected to the drain electrode of the third NMOS transistor 23 and to the first output terminal 7, and the gate electrode of the third PMOS transistor 26 is connected to the gate electrode of the first PMOS transistor 22 and to the first input terminal 5. The drain electrode of the third PMOS transistor 26 is connected to the drain electrode of the fifth NMOS transistor 28, and the source electrode of the fifth NMOS transistor 28 is connected to the low-potential side of the power supply Vss. A second bias voltage is input to the gate electrode of the fifth NMOS transistor 28. In this embodiment, the second bias voltage is the voltage of the high-potential side of the power supply Vdd; but the bias voltage is not limited to the power supply voltage Vdd, and need only be a voltage which turns on the fifth NMOS transistor 28 and which does not impede source follower operation.

Similarly, the source electrode of the fourth PMOS transistor 27 is connected to the drain electrode of the fourth NMOS transistor 25 and to the second output terminal 8, and the gate electrode of the fourth PMOS transistor 27 is connected to the gate electrode of the second PMOS transistor 24 and to the second input terminal 6. The drain electrode of the fourth PMOS transistor 27 is connected to the drain electrode of the sixth NMOS transistor 29, and the source electrode of the sixth NMOS transistor 29 is connected to the low-potential side of the power supply Vss. The second bias voltage is input to the gate electrode of the sixth NMOS transistor 29.

It is preferable that a back-gate electrode of the third PMOS transistor 26 be connected to the source electrode of the third PMOS transistor 26, and that a back-gate electrode of the fourth PMOS transistor 27 be connected to the source electrode of the fourth PMOS transistor 27. By connecting the back-gate electrodes of the PMOS transistors to the source electrodes in this way, the change in turn-on resistance with voltage input to the gate electrode can be made large. In the following explanation, the source follower comprised by the first PMOS transistor 22, second PMOS transistor 24, third NMOS transistor 23, and fourth NMOS transistor 25 is called the first source follower portion 20c, and the source follower comprised by the third PMOS transistor 26, fourth PMOS transistor 27, fifth NMOS transistor 28, and sixth NMOS transistor 29 is called the second source follower portion 20d.

Next, operation of the signal conversion circuit 2B is explained. Similarly to the signal conversion circuit 2A of the third embodiment, when differential voltage signals INp and INn are input to the first input terminal 5 and second input terminal 6 of the signal conversion circuit 2B, the following operation occurs, according to the input common-mode voltage level Vic, that is, the voltage levels of the differential voltage signals INp and INn.

(i) When the input common-mode voltage level Vic is equal to or greater than Vdd−Vthp and equal to or less than Vdd (equivalent to region A in FIG. 3), the differential amplifier portion 10 operates, and the source follower portion 20B does not operate, so that the output common-mode voltage level Voc is determined by the differential amplifier portion 10.

(ii) When the input common-mode voltage level Vic is equal to or greater than Vss and equal to or less than Vthn (equivalent to region B in FIG. 3), the source follower portion 20B operates, and the differential amplifier portion 10 does not operate, so that the output common-mode voltage Voc is determined by the source follower portion 20B.

(iii) When the input common-mode voltage level Vic is equal to or greater than Vthn and equal to or less than Vdd−Vthp (equivalent to region C in FIG. 3), the differential amplifier portion 10 and source follower portion 20B both operate, so that the output common-mode voltage level Voc is determined by both the differential amplifier portion 10 and by the source follower portion 20B.

Next, operation of the source follower portion 20B is explained in detail. The non-inverting amplification operation of the first source follower portion 20c in the source follower portion 20B is similar to that of the source follower portion 20A in the third embodiment.

In the above-described (ii) and (iii), when the second source follower portion 20d in the source follower portion 20B is operating, if the voltage level of the differential voltage signal INp input to the first input terminal 5 rises, the absolute value of the gate-source voltage of the third PMOS transistor 26 falls, and the drain-source turn-on resistance of the third PMOS transistor 26 increases. Then, the third PMOS transistor 26 drain-source current and fifth NMOS transistor 28 drain-source current decrease, and the voltage drop across the first resistor 11 decreases. As a result, the voltage level of the differential voltage signal OUT1p output from the first output terminal 7 rises.

On the other hand, the voltage level of the differential voltage signal INn input to the second input terminal 6 declines, so that the absolute value of the gate-source voltage of the fourth PMOS transistor 27 increases, and the drain-source turn-on resistance of the fourth PMOS transistor 27 decreases. Then, the fourth PMOS transistor 27 drain-source current and sixth NMOS transistor 29 drain-source current increase, and the voltage drop across the second resistor 12 increases. As a result, the voltage level of the differential voltage signal OUT1n output from the second output terminal 8 decreases. In this way, non-inverting amplification operation is performed by the second source follower portion 20d as well in the source follower portion 20B.

Similarly, in the second source follower portion 20d of the source follower portion 20B also, when the voltage level of the differential voltage signal INp input to the first input terminal 5 decreases and the voltage level of the differential voltage signal INn input to the second input terminal 6 increases, non-inverting amplification operation is performed such that the voltage level of the differential voltage signal OUT1p output from the first output terminal 7 falls, and the voltage level of the differential voltage signal OUT1n output from the second output terminal 8 rises.

When differential voltage signals INp and INn are input to the first input terminal 5 and second input terminal 6 respectively of the source follower portion 20B, the following operation occurs, according to the input common-mode voltage level Vic, that is, the voltage levels of the differential voltage signals INp and INn.

(iv) When the input common-mode voltage level Vic is equal to or greater than Vss and equal to or less than Vdd−Vthp−Vthn2, the first source follower portion 20c and second source follower portion 20d in the source follower portion 20B both operate.

(v) When the input common-mode voltage level Vic is equal to or greater than Vdd−Vthp−Vthn2 and equal to or less than Vdd−Vthp, the second source follower portion 20d in the source follower portion 20B operates, but the first source follower portion 20c does not operate.

When a drop in the power supply voltage Vdd occurs accompanying reduced power consumption, or when transistor threshold values Vthn, Vthn2, Vthp increase accompanying rises in junction temperatures or other changes occur, the upper limit Vdd−Vthp−Vthn2 of the input common-mode voltage level Vic at which operation of the first source follower portion 20c in the source follower portion 20B may become smaller than the lower limit Vthn of the input common-mode voltage level Vic at which the differential amplifier portion 10 can operate. That is, in the signal conversion circuit 2A of the third embodiment, there is the possibility that rail-to-rail input operation is not performed, regardless of the input common-mode voltage range at which the differential amplifier portion 10 and source follower portion 20A operate simultaneously. The relational expression for this situation is given by inequality (9) below.

$$Vdd-Vthp-Vthn2 < Vthn \qquad (9)$$

If the transistors in the differential amplifier portion 10 and the transistors in the source follower portion 20B are the same type, then Vthn is substantially equal to Vthn2, and so the above inequality (9) can be rewritten as inequality (10) below.

$$Vdd < 2Vthn+Vthp \qquad (10)$$

According to the above inequality (10), the power supply voltage is smaller than three times the threshold value of the transistors.

However, a necessary condition of a CMOS device is the ability to configure a logic circuit such as for example an inverter, and so the following conditional expressions obtain.

$$Vdd \geq Vthn + Vthp$$

$$Vdd - Vthp \geq Vthn \quad (11)$$

According to the above expressions (11), it is seen that the upper limit Vdd−Vthp of the input common-mode voltage levels Vic at which the second source follower portion 20$d$ in the source follower portion 20B can operate is higher than the lower limit Vthn of the input common-mode voltage levels Vic at which the differential amplifier portion 10 can operate. That is, in the fourth embodiment, there exists an input common-mode voltage region in which the differential amplifier portion 10 and the second source follower portion 20$d$ in the source follower portion 20B can operate simultaneously, so that rail-to-rail input operation is performed.

Thus in the signal conversion circuit 2B of the fourth embodiment also, a differential amplifier portion 10 and source follower portion 20B are comprised, so that operation is possible in a mode in which only the differential amplifier portion 10 operates, or in a mode in which both the differential amplifier portion 10 and the source follower portion 20B operate, or in a mode in which only the source follower portion 20B operates, according to the voltage levels of the differential voltage signals input to the first input terminal 5 and second input terminal 6. Further, in the signal conversion circuit 2B of the fourth embodiment also, the first source follower portion 20$c$ in the source follower portion 20B comprises a third NMOS transistor 23 and fourth NMOS transistor 25, so that through the action of these transistors the non-inverting amplification is intensified, and the non-inverting amplification gain can be increased. Hence advantageous results similar to those of the third embodiment can be obtained from the signal conversion circuit 2B of the fourth embodiment as well.

Further, the signal conversion circuit 2B of the fourth embodiment comprises a second source follower 20$d$, formed from a third PMOS transistor 26, fourth PMOS transistor 27, fifth NMOS transistor 28, and sixth NMOS transistor 29; hence even when, due to reduced power supply voltages accompanying lower power consumption and temperature fluctuations, there exists no input common-mode voltage region in which the differential amplifier portion 10 and first source follower portion 20$c$ of the source follower portion 20B operate simultaneously, there exists an input common-mode voltage region in which the differential amplifier portion 10 and the second source follower portion 20$d$ of the source follower portion 20B operate simultaneously. Hence by means of the signal conversion circuit 2B of the fourth embodiment, rail-to-rail input operation is possible.

Fifth Embodiment

Figure 7:
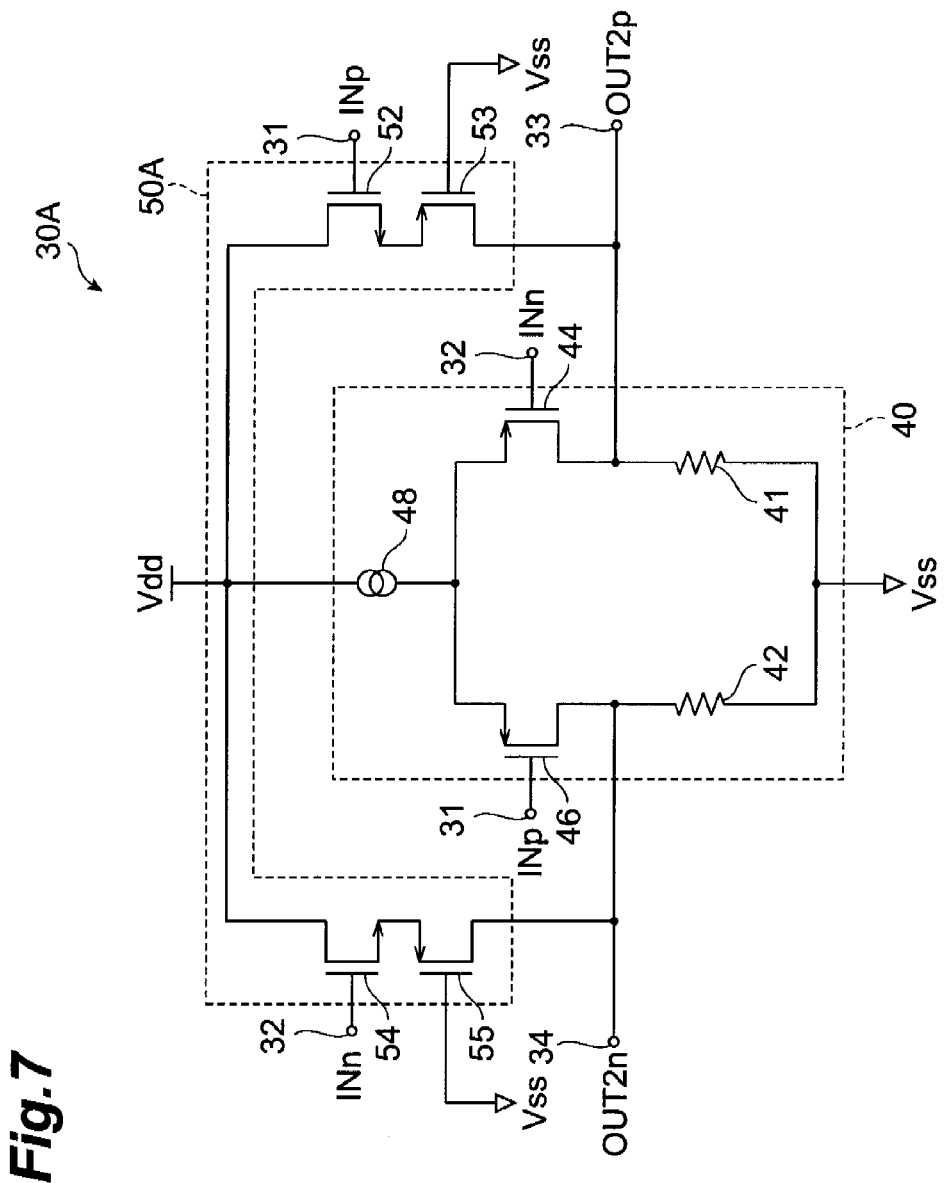
FIG. 7 is a circuit diagram of the signal conversion circuit of a fifth embodiment of the invention.

FIG. 7 is a circuit diagram showing the signal conversion circuit of a fifth embodiment of the invention. The signal conversion circuit 30A shown in FIG. 7 differs from the second embodiment in comprising a source follower portion 50A instead of the source follower portion 50 in the signal conversion circuit 30. Otherwise the configuration of the signal conversion circuit 30A is similar to that of the signal conversion circuit 30.

The source follower portion 50A differs from the source follower portion 50 in further comprising a third PMOS transistor 53 and fourth PMOS transistor 55. Otherwise the configuration of the source follower portion 50A is similar to that of the source follower portion 50.

The drain electrode of the third PMOS transistor 53 is connected to the first output terminal 33, and the source electrode of the third PMOS transistor 53 is connected to the source electrode of the first NMOS transistor 52. A first bias voltage is applied to the gate electrode of the third PMOS transistor 53. In this embodiment, the first bias voltage is the low-potential side voltage of the power supply Vss. The drain electrode of the first NMOS transistor 52 is connected to the high-potential side of the power supply Vdd, and the gate electrode of the first NMOS transistor 52 is connected to the first input terminal 31.

Similarly, the drain electrode of the fourth PMOS transistor 55 is connected to the second output terminal 34, and the source electrode of the fourth PMOS transistor 55 is connected to the source electrode of the second NMOS transistor 54. The first bias voltage is applied to the gate electrode of the fourth PMOS transistor 55. The drain electrode of the second NMOS transistor 54 is connected to the high-potential side of the power supply Vdd, and the gate electrode of the second NMOS transistor 54 is connected to the second input terminal 32.

It is preferable that a back-gate electrode of the first NMOS transistor 52 be connected to the source electrode of the first NMOS transistor 52, and it is preferable that a back-gate electrode of the second NMOS transistor 54 be connected to the source electrode of the second NMOS transistor 54. By thus connecting back-gate electrodes of the NMOS transistors to the source electrodes, the change in turn-on resistance with voltage input to the gate electrode can be increased.

Next, operation of the signal conversion circuit 30A is explained. Similarly to the signal conversion circuit 30 of the second embodiment, when differential voltage signals INp and INn are input to the first input terminal 31 and second input terminal 32 of the signal conversion circuit 30A, the following operation occurs, according to the input common-mode voltage level Vic, that is, the voltage levels of the differential voltage signals INp and INn. Here, Vthp2 is the threshold value of the third PMOS transistor 53 and fourth PMOS transistor 55.

(i) When the input common-mode voltage level Vic is equal to or greater than Vss and equal to or less than Vthn+Vthp2, the differential amplifier portion 40 operates, and the source follower portion 50A does not operate, so that the output common-mode voltage level Voc is determined by the differential amplifier portion 40.

(ii) When the input common-mode voltage level Vic is equal to or greater than Vdd−Vthp and equal to or less than Vdd, the source follower portion 50A operates, and the differential amplifier portion 40 does not operate, so that the output common-mode voltage Voc is determined by the source follower portion 50A.

(iii) When the input common-mode voltage level Vic is equal to or greater than Vthn+Vthp2 and equal to or less than Vdd−Vthp, the differential amplifier portion 40 and source follower portion 50A both operate, so that the output common-mode voltage level Voc is determined by both the differential amplifier portion 40 and by the source follower portion 50A.

Next, operation of the source follower portion 50A is explained in detail. When the source follower portion 50A is operating in the above-described (ii) and (iii), if the voltage level of the differential voltage signal INp input to the first input terminal 31 falls, the absolute value of the gate-source voltage of the first NMOS transistor 52 decreases, and the drain-source turn-on resistance of the first NMOS transistor 52 increases. Then the first NMOS transistor 52 drain-source current and third PMOS transistor 53 drain-source current decrease, and the voltage rise due to the first resistor 41 decreases. As a result, the voltage level of the differential voltage signal OUT2p output from the first output terminal 33 declines.

On the other hand, the voltage level of the differential voltage signal INn input to the second input terminal 32 rises, the absolute value of the second NMOS transistor 54 gate-source voltage increases, and the drain-source turn-on resistance of the second NMOS transistor 54 decreases. Hence the second NMOS transistor 54 drain-source current and fourth PMOS transistor 55 drain-source current increases, and the voltage rise due to the second resistor 42 increases. As a result, the voltage level of the differential voltage signal OUT2n output from the second output terminal 34 increases. In this way, non-inverting amplification is performed by the source follower portion 50A.

As explained above, when there is a drop in the voltage level of the differential voltage signal OUT2p output from the first output terminal 33, that is, in the drain voltage of the third PMOS transistor 53, the source voltage of the third PMOS transistor 53 drops accordingly, and the absolute value of the gate-source voltage of the third PMOS transistor 53 decreases. Hence the third PMOS transistor 53 drain-source turn-on resistance increases, and the first NMOS transistor 52 drain-source current and third PMOS transistor 53 drain-source current decrease further, so that the voltage rise due to the first resistor 41 falls further. As a result, the voltage level of the differential voltage signal OUT2p output from the first output terminal 33 further declines.

On the other hand, there is a rise in the voltage level of the differential voltage signal OUT2n output from the second output terminal 34, that is, in the drain voltage of the fourth PMOS transistor 55, and so the source voltage of the fourth PMOS transistor 55 rises accordingly, and the absolute value of the gate-source voltage of the fourth PMOS transistor 55 increases. Hence the fourth PMOS transistor 55 drain-source turn-on resistance decreases, and the second NMOS transistor 54 drain-source current and fourth PMOS transistor 55 drain-source current further increase, so that the voltage rise due to the second resistor 42 further increases. As a result, the voltage level of the differential voltage signal OUT2n output from the second output terminal 34 rises further. In this way, non-inverting amplification is intensified by the source follower portion 50A, and the non-inverting amplification gain is increased.

Similarly, when in the source follower portion 50A the voltage level of the differential voltage signal INp input to the first input terminal 31 rises, and the voltage level of the differential voltage signal INn input to the second input terminal 32 falls, non-inverting amplification is intensified such that the voltage level of the differential voltage signal OUT2p output from the first output terminal 33 rises, and the voltage level of the differential voltage signal OUT2n output from the second output terminal 34 falls.

Thus in the signal conversion circuit 30A of the fifth embodiment also, a differential amplifier portion 40 and source follower portion 50A are comprised, so that operation is possible either in a mode in which only the differential amplifier portion 40 operates, or in a mode in which both the differential amplifier portion 40 and the source follower portion 50A operate, or in a mode in which only the source follower portion 50A operates, according to the voltage level of differential voltage signals input to the first input terminal 31 and second input terminal 32, so that advantages similar to those of the second embodiment can be obtained.

Moreover, in the signal conversion circuit 30A of the fifth embodiment, the non-inverting amplification by the first NMOS transistor 52 and second NMOS transistor 54 in the source follower portion 50A is intensified by the action of the third PMOS transistor 53 and fourth PMOS transistor 55. Hence by means of the signal conversion circuit 30A of the fifth embodiment, the gain can be made large through an increase in current, that is, an increase in transistor size (gate width/gate length), without increasing the resistance value of the first resistor 41 or the resistance value of the second resistor 42. Further, by means of the signal conversion circuit 30A of the fifth embodiment, the gain can be made large without increasing the mutual conductances of the transistors of the differential amplifier 40 (first PMOS transistor 44 and second PMOS transistor 46) or of the transistors of the source follower portion 50A (first NMOS transistor 52 and second NMOS transistor 54). Hence by means of the signal conversion circuit 30A of the fifth embodiment, the gain can be increased without detracting from high-speed characteristics, and without increasing the circuit area or power consumption.

Further, by means of the signal conversion circuit 30A of the fifth embodiment, the gain can be made large while suppressing declines in high-speed characteristics, so that reductions in signal quality of differential voltage signals can be suppressed.

By means of a rail-to-rail circuit 1 comprising the signal conversion circuit 30A of this fifth embodiment, a fast, high-gain signal conversion circuit 30A can be comprised in the input stage, so that degradation of the signal quality of differential voltage signals can be suppressed. For example, the transition times (rise times and fall times) of differential voltage signals output from the rail-to-rail circuit 1 can be shortened. As a result, AC timing scattering in phases between synchronized signals can be reduced in serial/parallel conversion circuits, signal identification circuits, and similar in later stages of the rail-to-rail circuit 1. These advantageous results are important when there is considerable reduction of the signal quality of differential voltage signals arising from reduced power consumption, that is, from lower voltages.

Sixth Embodiment

Figure 8:
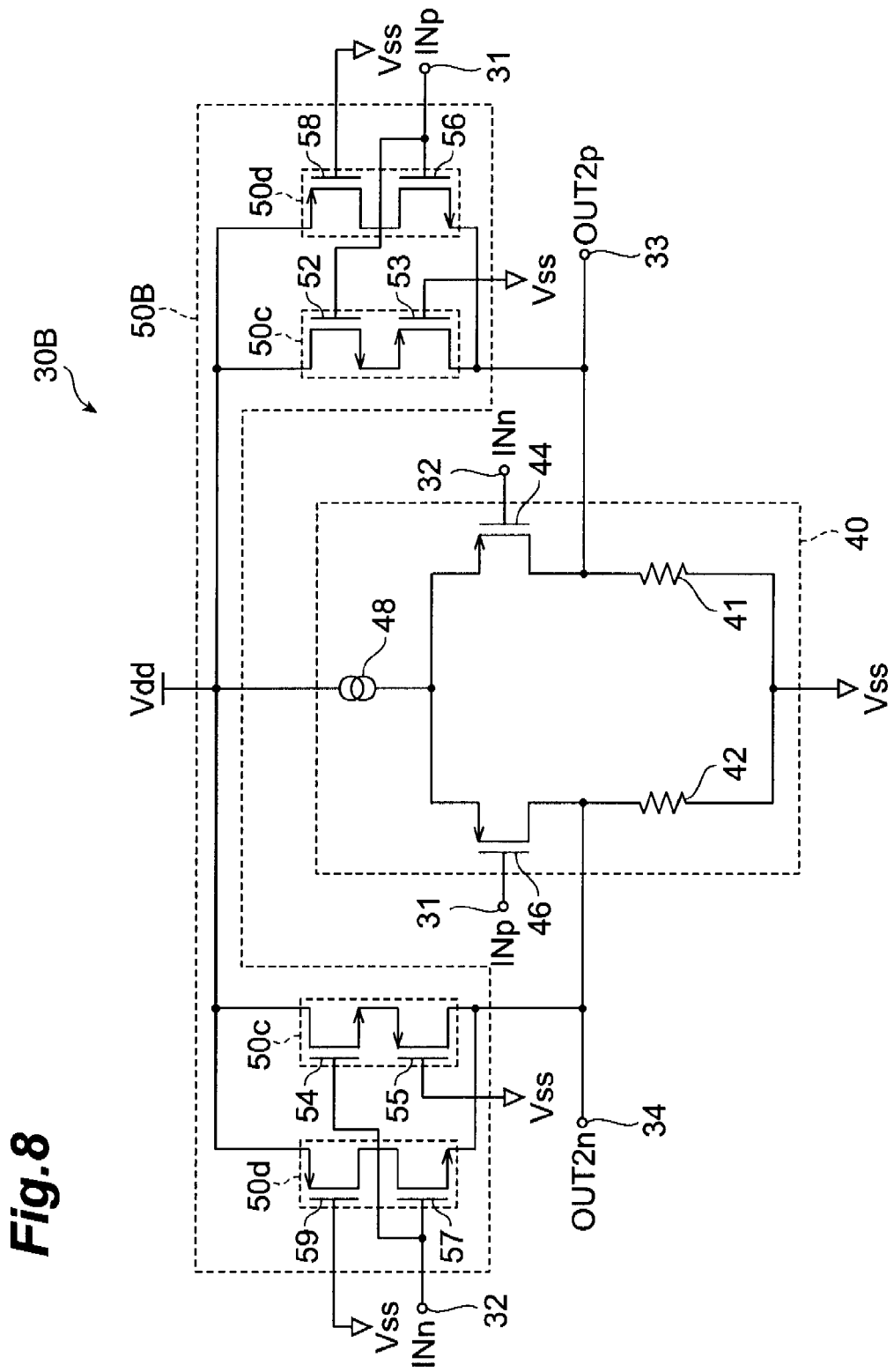
FIG. 8 is a circuit diagram of the signal conversion circuit of a sixth embodiment of the invention.

FIG. 8 is a circuit diagram showing the signal conversion circuit of a sixth embodiment of the invention. The signal conversion circuit 30B shown in FIG. 8 differs from the fifth embodiment in comprising the source follower portion 50B instead of the source follower portion 50A in the signal conversion circuit 30A. Otherwise the configuration of the signal conversion circuit 30B is similar to that of the signal conversion circuit 30A.

The source follower portion 50B differs from the source follower portion 50A in further comprising a third NMOS transistor 56, fourth NMOS transistor 57, fifth PMOS transistor 58, and sixth PMOS transistor 59. Otherwise the configuration of the source follower portion 50B is similar to that of the source follower portion 50A.

The source electrode of the third NMOS transistor 56 is connected to the drain electrode of the third PMOS transistor 53 and to the first output terminal 33, and the gate electrode of the third NMOS transistor 56 is connected to the gate electrode of the first NMOS transistor 52 and to the first input terminal 31. The drain electrode of the third NMOS transistor 56 is connected to the drain electrode of the fifth PMOS transistor 58, and the source electrode of the fifth PMOS transistor 58 is connected to the high-potential side of the power supply Vdd. A second bias voltage is input to the gate electrode of the fifth PMOS transistor 58. In this embodiment, the second bias voltage is the voltage of the low-potential side of the power supply Vss, but the power supply voltage Vss need not be used, and any voltage may be used which turns on the fifth NMOS transistor 58 and which does not impede source follower operation.

Similarly, the source electrode of the fourth NMOS transistor 57 is connected to the drain electrode of the fourth PMOS transistor 55 and to the second output terminal 34, and the gate electrode of the fourth NMOS transistor 57 is connected to the gate electrode of the second NMOS transistor 54 and to the second input terminal 32. The drain electrode of the fourth NMOS transistor 57 is connected to the drain electrode of the sixth PMOS transistor 59, and the source electrode of the sixth PMOS transistor 59 is connected to the high-potential side of the power supply Vdd. The second bias voltage is input to the gate electrode of the sixth PMOS transistor 59.

In the following explanation, the source follower comprising the first NMOS transistor 52, second NMOS transistor 54, third PMOS transistor 53, and fourth PMOS transistor 55 is called the first source follower portion 50$c$, and the source follower comprising the third NMOS transistor 56, fourth NMOS transistor 57, fifth PMOS transistor 58, and sixth PMOS transistor 59 is called the second source follower portion 50$d$.

Next, operation of the signal conversion circuit 30B is explained. Similarly to the signal conversion circuit 30A of the fifth embodiment, when differential voltage signals INp and INn are input to the first input terminal 31 and second input terminal 32 respectively of the signal conversion circuit 30B, the following operation takes place, according to the input common-mode voltage level Vic, that is, according to the voltage levels of the differential voltage signals INp and INn.

(i) When the input common-mode voltage level Vic is equal to or greater than Vss and equal to or less than Vthn, the differential amplifier portion 40 operates, and the source follower portion 50B does not operate, so that the output common-mode voltage level Voc is determined by the differential amplifier portion 40.

(ii) When the input common-mode voltage level Vic is equal to or greater than Vdd−Vthp and equal to or less than Vdd, the source follower portion 50B operates, and the differential amplifier portion 40 does not operate, so that the output common-mode voltage level Voc is determined by the source follower portion 50B.

(iii) When the input common-mode voltage level Vic is equal to or greater than Vthn and equal to or less than Vdd−Vthp, the differential amplifier portion 40 and source follower portion 50B both operate, so that the output common-mode voltage level Voc is determined by both the differential amplifier portion 40 and by the source follower portion 50B.

Next, operation of the source follower portion 50B is explained in detail. The non-inverting amplification operation of the first source follower portion 50$c$ in the source follower portion 50B is similar to that of the source follower portion 50A in the fifth embodiment.

When the second source follower portion 50$d$ in the source follower portion 50B is operating in the above-described (ii) and (iii), if the voltage level of the differential voltage signal INp input to the first input terminal 31 falls, the absolute value of the gate-source voltage of the third NMOS transistor 56 decreases, and the drain-source turn-on resistance of the third NMOS transistor 56 increases. Then the third NMOS transistor 56 drain-source current and fifth PMOS transistor 58 drain-source current decrease, and the voltage rise due to the first resistor 41 decreases. As a result, the voltage level of the differential voltage signal OUT2$p$ output from the first output terminal 33 declines.

On the other hand, the voltage level of the differential voltage signal INn input to the second input terminal 32 rises, the absolute value of the fourth NMOS transistor 57 gate-source voltage increases, and the drain-source turn-on resistance of the fourth NMOS transistor 57 decreases. Hence the fourth NMOS transistor 57 drain-source current and sixth PMOS transistor 59 drain-source current increases, and the voltage rise due to the second resistor 42 increases. As a result, the voltage level of the differential voltage signal OUT2$n$ output from the second output terminal 34 increases. In this way, non-inverting amplification is performed by the second source follower portion 50$d$ in the source follower portion 50B.

Similarly, when in the second source follower portion 50$d$ the voltage level of the differential voltage signal INp input to the first input terminal 31 rises and the voltage level of the differential voltage signal INn input to the second input terminal 32 falls, non-inverting amplification operation is performed such that the voltage level of the differential voltage signal OUT2$p$ output from the first output terminal 33 rises, and the voltage level of the differential voltage signal OUT2$n$ output from the second output terminal 34 falls.

When differential voltage signals INp and INn are input to the first input terminal 31 and second input terminal 32 respectively, the source follower portion 50B performs the following operation, according to the input common-mode voltage Vic, that is, the voltage levels of the differential voltage signals INp and INn.

(iv) When the input common-mode voltage level Vic is equal to or greater than Vthn+Vthp2 and equal to or less than Vdd, the first source follower portion 50$c$ and second source follower portion 50$d$ in the source follower portion 50B both operate.

(v) When the input common-mode voltage level Vic is equal to or greater than Vthn and equal to or less than Vthn+Vthp2, the second source follower portion 50$d$ in the source follower portion 50B operates, but the first source follower portion 50$c$ does not operate.

In the above explanations, a positive power supply Vdd with Vss as reference is assumed; in the following explanation, however, for purposes of clarification, a negative power supply −Vss with Vdd as reference is considered. Then the above-described (iv) and (v) may be restated as follows.

(iv) When the input common-mode voltage level Vic is equal to or greater than −Vss+Vthn+Vthp2 and equal to or less than Vdd, the first source follower portion 50$c$ and second source follower portion 50$d$ in the source follower portion 50B both operate.

(v) When the input common-mode voltage level Vic is equal to or greater than −Vss+Vthn and equal to or less than −Vss+Vthn+Vthp2, the second source follower portion 50$d$ in the source follower portion 50B operates, but the first source follower portion 50$c$ does not operate.

Here, when a rise in the voltage of the negative power supply −Vss accompanying a reduction in power consumption, or an increase in the threshold values Vthn, Vthp, Vthp2 of transistors accompanying rises in junction temperatures, or similar events occur, the lower limit −Vss+Vthn+Vthp2 of the input common-mode voltage level Vic for which operation of the first source follower portion 50c in the source follower portion 50B is possible may become higher than the upper limit −Vthp of the input common-mode voltage level Vic for which operation of the differential amplifier portion 40 is possible. That is, in the signal conversion circuit 30B of the sixth embodiment, it is possible that there exists no input common-mode voltage range in which the differential amplifier portion 40 and the source follower portion SOB operate simultaneously, and that operation with rail-to-rail input is not performed. The relational expression at this time is given by inequality (12).

$$-Vss+Vthn+Vthp2>-Vthp \quad (12)$$

If the transistors in the differential amplifier portion 40 and the transistors in the source follower portion 50B are the same type, then Vthp is substantially equal to Vthp2, and so the above inequality (12) can be rewritten as inequality (13) below.

$$Vss<Vthn+2Vthp \quad (13)$$

According to the above inequality (13), the absolute value of the power supply voltage is smaller than three times the absolute value of the threshold value of the transistors.

However, a necessary condition of a CMOS device is the ability to configure a logic circuit such as for example an inverter, and so the following conditional expressions obtain.

$$Vss \leq Vthn+Vthp$$

$$-Vss+Vthn \leq -Vthp \quad (14)$$

According to the above expressions (14), it is seen that the lower limit −Vss+Vthn of the input common-mode voltage level Vic at which the second source follower portion 50d in the source follower portion 50B can operate is lower than the upper limit −Vthp of the input common-mode voltage level Vic at which the differential amplifier portion 40 can operate. That is, in the sixth embodiment, there exists an input common-mode voltage region in which the differential amplifier portion 40 and the second source follower portion 50d in the source follower portion 50B can operate simultaneously, so that rail-to-rail input operation is performed.

Thus in the signal conversion circuit 30B of the sixth embodiment also, a differential amplifier portion 40 and source follower portion 50B are comprised, so that operation is possible in a mode in which only the differential amplifier portion 40 operates, or in a mode in which both the differential amplifier portion 40 and the source follower portion 50B operate, or in a mode in which only the source follower portion 50B operates, according to the voltage levels of the differential voltage signals input to the first input terminal 31 and second input terminal 32. Further, in the signal conversion circuit 30B of the sixth embodiment also, the first source follower portion 50c in the source follower portion 50B comprises a third PMOS transistor 53 and fourth PMOS transistor 55, so that through the action of these transistors the non-inverting amplification is intensified, and the non-inverting amplification gain can be increased. Hence advantageous results similar to those of the fifth embodiment can be obtained from the signal conversion circuit 30B of the sixth embodiment as well.

Further, the signal conversion circuit 30B of the sixth embodiment comprises a second source follower 50d, formed from a third NMOS transistor 56, fourth NMOS transistor 57, fifth PMOS transistor 58, and sixth PMOS transistor 59; hence even when, due to reduced power supply voltages accompanying lower power consumption and temperature fluctuations, there exists no input common-mode voltage region in which the differential amplifier portion 40 and first source follower portion 50c of the source follower portion 50B operate simultaneously, there exists an input common-mode voltage region in which the differential amplifier portion 40 and the second source follower portion 50d of the source follower portion 50B operate simultaneously. Hence by means of the signal conversion circuit 30B of the sixth embodiment, rail-to-rail input operation is possible.

INDUSTRIAL APPLICABILITY

This invention can be employed in applications which require reduction of circuit area and current consumption, as well as fast operation.

The invention claimed is:
1. A signal conversion circuit, which takes as input differential voltage signals to a first input terminal and a second input terminal, converts the common-mode voltage level of the differential voltage signals, and outputs differential voltage signals, with said converted common-mode voltage level, from a first output terminal and a second output terminal, comprising:
   a first resistor, one end of which is connected to a high-potential side of a power supply, and the other end of which is connected to said first output terminal;
   a second resistor, one end of which is connected to said high-potential side of the power supply, and the other end of which is connected to said second output terminal;
   a first NMOS transistor, having a drain electrode connected to said first output terminal, a gate electrode connected to said second input terminal, and a source electrode;
   a second NMOS transistor, having a drain electrode connected to said second output terminal, a gate electrode connected to said first input terminal, and a source electrode;
   a first PMOS transistor, having a source electrode connected to said first output terminal, a gate electrode connected to said first input terminal, and a drain electrode connected to a low-potential side of the power supply;
   a second PMOS transistor, having a source electrode connected to said second output terminal, a gate electrode connected to said second input terminal, and a drain electrode connected to said low-potential side of the power supply; and
   a current source, which is provided between the source electrode of said first NMOS transistor and source electrode of said second NMOS transistor on the one hand, and said low-potential side of the power supply on the other, and which generates a constant current,
   wherein the drain electrode of the first PMOS transistor is connected to said low-potential side of the power supply without having said current source in between, and
   wherein the drain electrode of the second PMOS transistor is connected to said low-potential side of the power supply without having said current source in between.
2. A signal conversion circuit, which takes as input differential voltage signals to a first input terminal and a second input terminal, converts the common-mode voltage level of the differential voltage signals, and outputs differential volt- age signals, with said converted common-mode voltage level, from a first output terminal and a second output terminal, comprising:
- a first resistor, one end of which is connected to a low-potential side of a power supply, and the other end of which is connected to said first output terminal;
- a second resistor, one end of which is connected to said low-potential side of the power supply, and the other end of which is connected to said second output terminal;
- a first PMOS transistor, having a drain electrode connected to said first output terminal, a gate electrode connected to said second input terminal, and a source electrode;
- a second PMOS transistor, having a drain electrode connected to said second output terminal, a gate electrode connected to said first input terminal, and a source electrode;
- a first NMOS transistor, having a source electrode connected to said first output terminal, a gate electrode connected to said first input terminal, and a drain electrode connected to a high-potential side of the power supply;
- a second NMOS transistor, having a source electrode connected to said second output terminal, a gate electrode connected to said second input terminal, and a drain electrode connected to said high-potential side of the power supply; and
- a current source, which is provided between the source electrode of said first PMOS transistor and source electrode of said second PMOS transistor on the one hand, and said high-potential side of the power supply on the other, and which generates a constant current, wherein the drain electrode of the first NMOS transistor is connected to said high-potential side of the power supply without having said current source in between, and wherein the drain electrode of the second NMOS transistor is connected to said high-potential side of the power supply without having said current source in between.

3. The signal conversion circuit according to claim 1, wherein the drain electrode of the first PMOS transistor is connected directly to said low-potential side of the power supply, and wherein the drain electrode of the second PMOS transistor is connected directly to said low-potential side of the power supply.

4. The signal conversion circuit according to claim 2, wherein the drain electrode of the first NMOS transistor is connected directly to said high-potential side of the power supply, and wherein the drain electrode of the second NMOS transistor is connected directly to said high-potential side of the power supply.

* * * * *